(12) United States Patent
Ohtani et al.

(10) Patent No.: US 6,861,670 B1
(45) Date of Patent: Mar. 1, 2005

(54) SEMICONDUCTOR DEVICE HAVING MULTI-LAYER WIRING

(75) Inventors: Hisashi Ohtani, Kanagawa (JP);
Misako Nakazawa, Kanagawa (JP);
Satoshi Murakami, Kanagawa (JP);
Etsuko Fujimoto, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/535,836

(22) Filed: Mar. 28, 2000

(30) Foreign Application Priority Data

Apr. 1, 1999 (JP) ............................................. 11-094746

(51) Int. Cl.[7] .......................... H01L 29/76; H01L 23/58; H01L 23/48
(52) U.S. Cl. .......................... 257/66; 257/642; 257/773
(58) Field of Search .............................. 257/66–69, 642, 257/643, 758, 759, 773, 774, 382, 383; 438/618, 629, 637, 639, 640, 666

(56) References Cited

U.S. PATENT DOCUMENTS

| | | | |
|---|---|---|---|
| 4,184,909 A | | 1/1980 | Chang et al. ................ 156/643 |
| 5,372,971 A | | 12/1994 | Kang et al. .................. 437/195 |
| 5,468,342 A | | 11/1995 | Nulty et al. ............... 156/643.1 |
| 5,594,569 A | | 1/1997 | Konuma et al. ............. 349/122 |
| 5,643,826 A | | 7/1997 | Ohtani et al. .................. 437/88 |
| 5,648,277 A | | 7/1997 | Zhang et al. .................. 437/21 |
| 5,760,429 A | * | 6/1998 | Yano et al. .................. 257/211 |
| 5,767,015 A | * | 6/1998 | Tabara ........................ 438/654 |
| 5,777,701 A | * | 7/1998 | Zhang ......................... 349/138 |
| 5,868,951 A | | 2/1999 | Schuck, III et al. ........... 216/24 |
| 5,923,962 A | | 7/1999 | Ohtani et al. ................ 438/150 |
| 5,977,580 A | * | 11/1999 | Yoon ............................ 257/306 |
| 5,990,542 A | * | 11/1999 | Yamazaki .................... 257/642 |
| 6,115,094 A | * | 9/2000 | Fukunaga .................... 349/138 |
| 6,255,705 B1 | * | 7/2001 | Zhang et al. ................ 257/412 |
| 6,384,818 B1 | * | 5/2002 | Yamazaki et al. .......... 345/206 |

FOREIGN PATENT DOCUMENTS

| | | |
|---|---|---|
| GB | 2 306 778 | 5/1997 |
| JP | 7-130652 | 5/1995 |
| JP | 7-135318 | 5/1995 |
| JP | 9-312260 | 12/1997 |
| JP | 10-247735 | 9/1998 |
| JP | 10-294280 | 11/1998 |
| JP | 11-191628 | 7/1999 |
| JP | 11-345767 | 12/1999 |
| JP | 11-354442 | 12/1999 |

OTHER PUBLICATIONS

Inui, S. et al. "Threholdless Antiferroelectricity in Liquid Crystals and its Application to Displays," J. Mater Chem., vol. 6, No. 4, pp. 671–673, 1996.

Yoshida, T. et al, "A Full–Color Thresholdless Antiferroelectric LCD Exhibiting Wide Viewing Angle with Fast Response Time," SID 97 Digest, pp. 841–844, 1997.

Furue, H. et al, "Characteristics and Driving Scheme of Polymer–Stabilized Monostable FLCD Exhibiting Fast Response Time and High Contrast Ratio with Gray–Scale Capability," SID 98 Digest, pp. 782–785, 1998.

Hatano, M. et al, "A Novel Self–Aligned Gate–Overlapped LDD Poly–Si TFT with High Reliability and Performance," IEDM Technical Digest 97, pp. 523–526, 1997.

(List continued on next page.)

Primary Examiner—Hung Vu
(74) Attorney, Agent, or Firm—Cook, Alex, McFarron, Manzo, Cummings & Mehler, Ltd.

(57) ABSTRACT

The object is to pattern extremely fine integrated circuits by forming fine contact holes. The dry etching method is employed to form contact holes to pattern a wiring (114), using a mask made of metallic film (112) and an organic material as an inter-layer insulating film (111) for covering switching elements and each of the wirings.

36 Claims, 18 Drawing Sheets

OTHER PUBLICATIONS

English abstract re Japanese patent application No. 7-130652, published May 19, 1995.

English abstract re Japanese patent application No. 7-135318 published May 23, 1995.

English abstract re Japanese patent application No. 9-312260 published Dec. 2, 1997.

English abstract re Japanese patent application No. 10-247735, published Sep. 14, 1998.

English abstract re Japanese patent application No. 10-294280, published Nov. 4, 1998.

English abstract re Japanese patent application No. 11-191628, published Jul. 13, 1999.

English abstract re Japanese patent application No. 11-345767, published Dec. 14, 1999.

English abstract re Japanese patent application No. 11-354442, published Dec. 24, 1999.

European Search Report re application No. EP 00 10 6863; published Jul. 10, 2000.

* cited by examiner

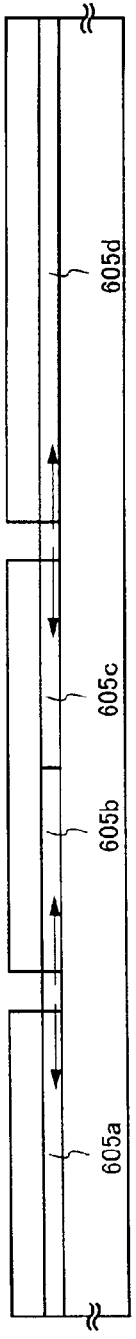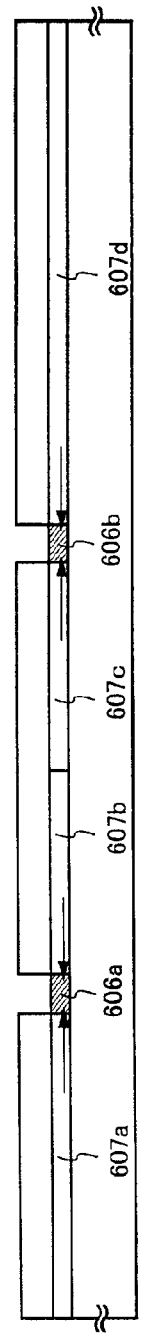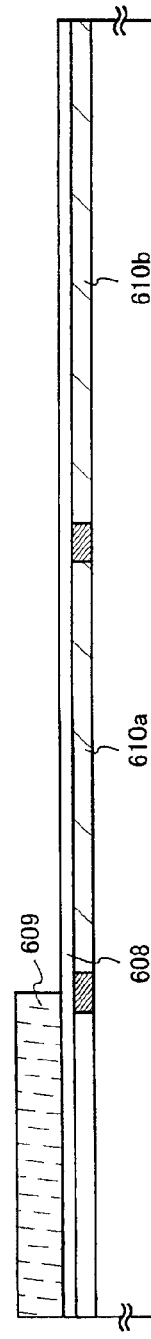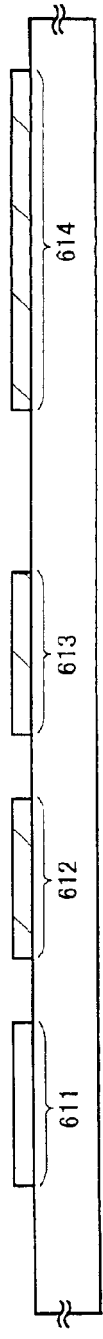

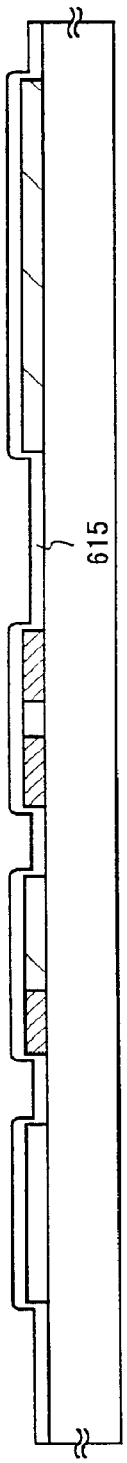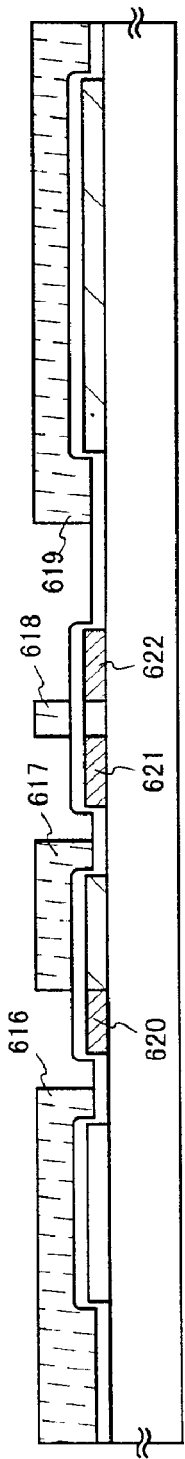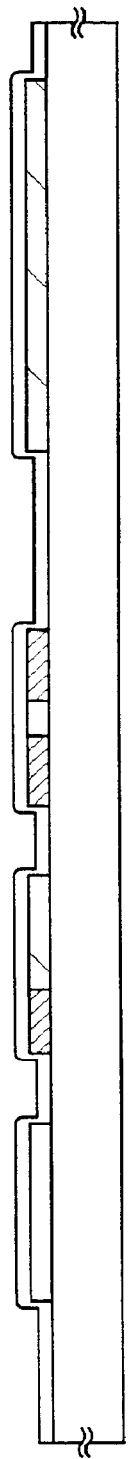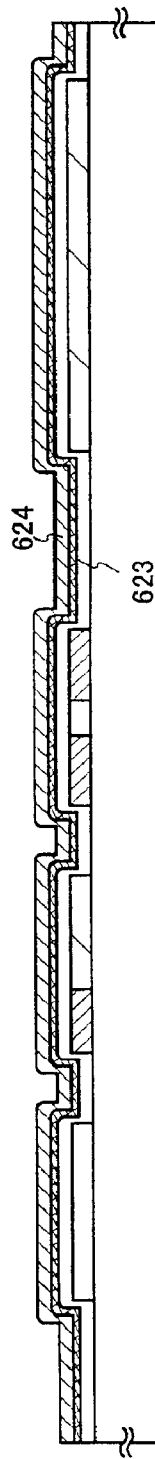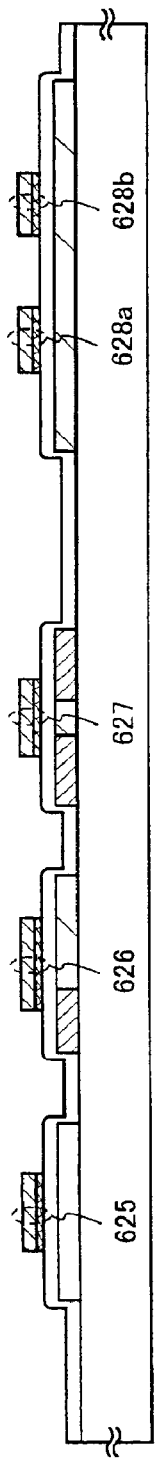

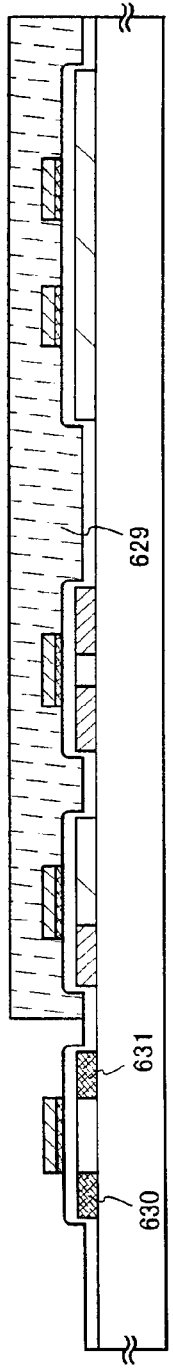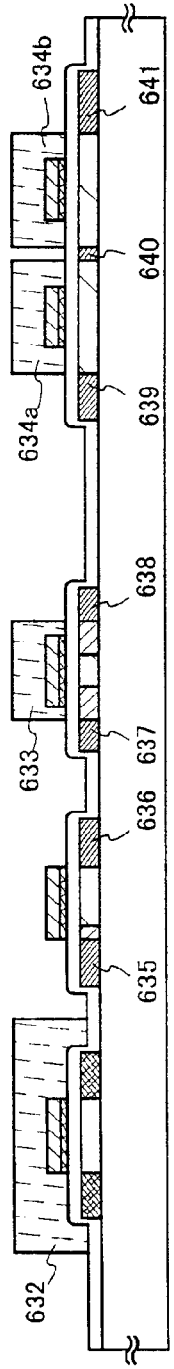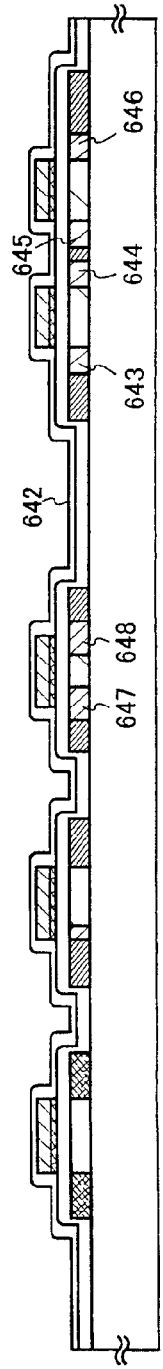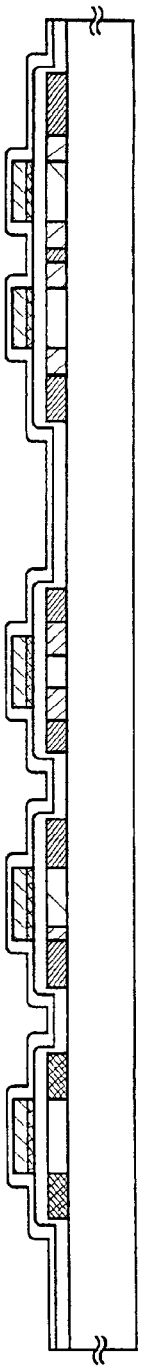

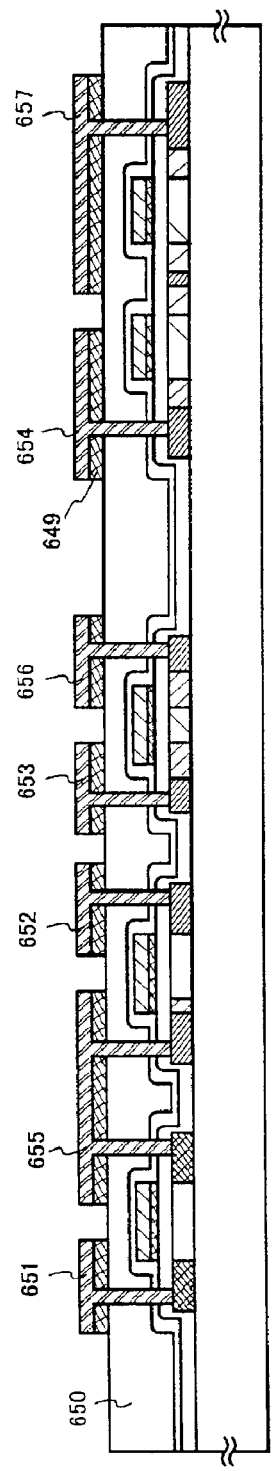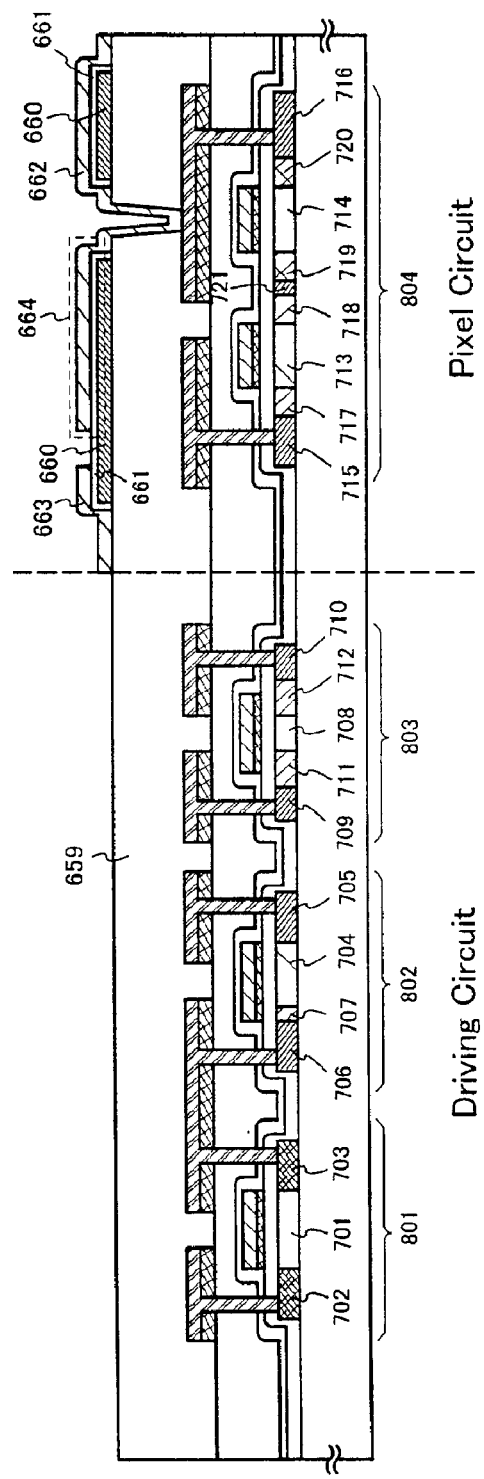
Fig. 9A
Fig. 9B

SEMICONDUCTOR DEVICE HAVING MULTI-LAYER WIRING

FIELD OF THE INVENTION

The present invention relates to a structure and the method for fabricating a semiconductor device. More particularly, it relates to an active matrix liquid-crystal display device which employs semiconductor thin layer and a method for fabricating the device. Moreover, the present invention can be applied to electro-optical devices comprising such a display device.

Furthermore, it is to be understood that any device that can function by employing semiconductor properties is called a semiconductor device in this specification. Accordingly, the semiconductor devices cited in the aforementioned claims include not only single semiconductor elements such as TFTs but also semiconductor circuits comprising semiconductor elements, electro-optical devices, and electrical apparatuses to which these are mounted as components. A thin film transistor (TFT) is a representative example of semiconductor elements. Also available are an insulating-gate field effect transistor (IGFET), a thin film diode, a MIM element, and a varistor element.

BACKGROUND OF THE INVENTION

Recently, techniques for fabricating semiconductor devices with semiconductor thin films formed on an insulating substrate, for example, semiconductor devices with semiconductor elements such as thin film transistors (TFT) have been rapidly developed. This is because of the increasing demand for liquid-crystal display devices (typically, active matrix liquid-crystal display devices). The active matrix liquid-crystal display device displays images by controlling electric charges flowing into and out of several hundred thousands to several millions of display pixels arranged in a matrix by means of switching elements of the display pixels.

Moreover, the semiconductor device comprises integrated circuits such as active matrix circuits formed by using TFTs or the like, ICs, ULSIs, and VLSIs. There are increasing tendencies to provide much finer integrated circuits, thus requiring sub-micron patterns.

Accordingly, such attempts have been made to reduce the size (such as the width of wirings and channels, and the diameter of contact holes) of each portion of the semiconductor elements in integrated circuits. In particular, there are increasing necessities for ensuring electrical connections at the bottom of a contact hole small in diameter by finer and multi-layer tracing techniques.

Conventionally, insulating films deposited by the CVD method have been frequently used as inter-layer insulating films, and the dry etching method or the wet etching method have been used to form contact holes.

For example, in cases where a silicon oxide film is used as a first inter-layer insulating film of a thin film transistor, the wet etching method is used to form contact holes from the viewpoints of the selective ratio between the inter-layer insulating film and the semiconductor layer and the ease in fabrication. Where the dry etching method is used, since the silicon oxide film and the semiconductor layer predominantly composed of silicon have the same main ingredient, such a problem was present in that the selective ratio was low and the semiconductor layer, which is thin in thickness, was stripped off at the same time.

However, in cases where much finer contact holes than conventional ones were to be formed, the wet etching method is an isotropic etching method, so that over-etching inevitably occurred and thus finer patterning had been prevented. For example, in a case where a contact hole 2 μm in diameter is to be formed, a resultant contact hole would be about two times or more in diameter which is dependent on thickness.

The present invention relates to a method for forming a finer contact hole (typically, 2 through 3 μm or less) than a conventional one, particularly in a fabrication method of sub-micron thin film transistors.

The present invention is adapted to use an organic material in inter-layer insulating films and form contact holes by the dry etching method in an inter-layer insulating film composed of the organic material.

Conventionally, in the case where a resist mask was used in the dry etching method, since the mask has a similar constituent, it was difficult to ensure the selective ratio between the film of an organic material and the resist mask and thus contact holes were formed with difficulty. Therefore, use of a resist mask to form contact holes that were provided in inter-layer insulating films composed of an organic material was avoided.

The invention to be disclosed in this specification provides the theme to solve the aforementioned problems to form fine contact holes and thus provide finer patterning of integrated circuits.

SUMMARY OF THE INVENTION

A configuration of the present invention that is disclosed in this specification is a semiconductor device comprising:
  an inter-layer insulating film composed of an organic material on a conductive material layer,
  a first metallic layer on said inter-layer insulating film, and
  a second metallic layer on said first metallic film,
  wherein said conductive material layer and said second metallic layer are connected to each other at the bottom of a contact hole provided in said inter-layer insulating film.

Furthermore, another configuration of the present invention is a semiconductor device comprising:
  an inter-layer insulating film composed of an organic material on a thin film transistor,
  a first metallic layer on said inter-layer insulating film, and
  a second metallic layer on said first metallic layer,
  wherein the source region or the drain region of said thin film transistor and the said second metallic layer are connected to each other at the bottom of a contact hole provided in said inter-layer insulating film.

It is possible to use a conductive material as the first metallic layer or the second metallic layer in the aforementioned configurations. For example, a material layer predominantly is composed of Al, Ta, Ti, Cr, W, Mo or silicon provided with conductivity, or multi-layer film comprised thereof can be used. Furthermore, the first metallic layer is preferably composed of aluminum, which has low resistance, and a material predominantly composed of aluminum.

Furthermore, the aforementioned second metallic layer is preferably composed of titanium, which has an excellent contact property, and a material predominantly composed of titanium.

In the aforementioned respective configurations, said inter-layer insulating film is characterized by being made of an organic-based resin predominantly composed of polyimide, polyimide-amide, polyamide, acrylics, or BCB (benzocyclobutane).

Furthermore, the present invention for implementing the aforementioned configurations is characterized by comprising the steps of:

forming a thin film transistor on an insulating surface, depositing an inter-layer insulating film composed of an inorganic material to cover said thin film transistor, depositing a first metallic film to cover said inter-layer insulating film, patterning said first metallic film to form a first metallic layer, with said first metallic layer employed as a mask, etching said inter-layer insulating film to form contact holes, depositing a second metallic film to cover said first metallic layer and said contact holes, and patterning said first metallic layer and said second metallic film to form wirings, part of the wirings having a multi-layer structure.

Furthermore, another configuration of the present invention is comprised of a method for fabricating a semiconductor device which is characterized by comprising the steps of:

forming a first conductive material layer on an insulating surface, depositing an inter-layer insulating film composed of an organic material to cover said first material layer, depositing a first metallic film to cover said inter-layer insulating film, patterning said first metallic film to form a first metallic layer, with said first metallic layer employed as a mask, etching said inter-layer insulating film to form contact holes, depositing a second metallic film to cover said first metallic layer and said contact holes, depositing an inorganic film to cover said second metallic film, patterning said first metallic layer, said second metallic film, and said inorganic film to form wirings having an inorganic layer on the upper surface thereof, and forming a second conductive material layer in contact with said wirings to form a capacitor between said wirings and said second material layer with said inorganic layer as a dielectric substance.

In the aforementioned configuration, said inorganic film is characterized by being deposited by a CVD method.

Furthermore, in the aforementioned respective configurations, said first metallic film and said second metallic film are characterized by being deposited by a sputtering method.

Furthermore, it is to be understood, in the aforementioned respective configurations, that what is formed by deposition and obtained immediately thereafter is called a "film", while what is patterned is called a "layer".

The foregoing and other features and advantages of the present invention will become more readily more appreciated as the same becomes better understood by reference to the following detailed description when taken into conjunction with the accompanying drawings wherein.

BRIEF DESCRIPTION OF THE DRAWINGS

FIG. 6 is a view showing an example of the fabrication process of the present invention.

FIG. 7 is a view showing an example of the fabrication process of the present invention.

FIG. 8 is a view showing an example of the fabrication process of the present invention.

FIG. 9 is a view showing an example of the fabrication process of the present invention.

PREFERRED EMBODIMENTS OF THE INVENTION

Figure 1:
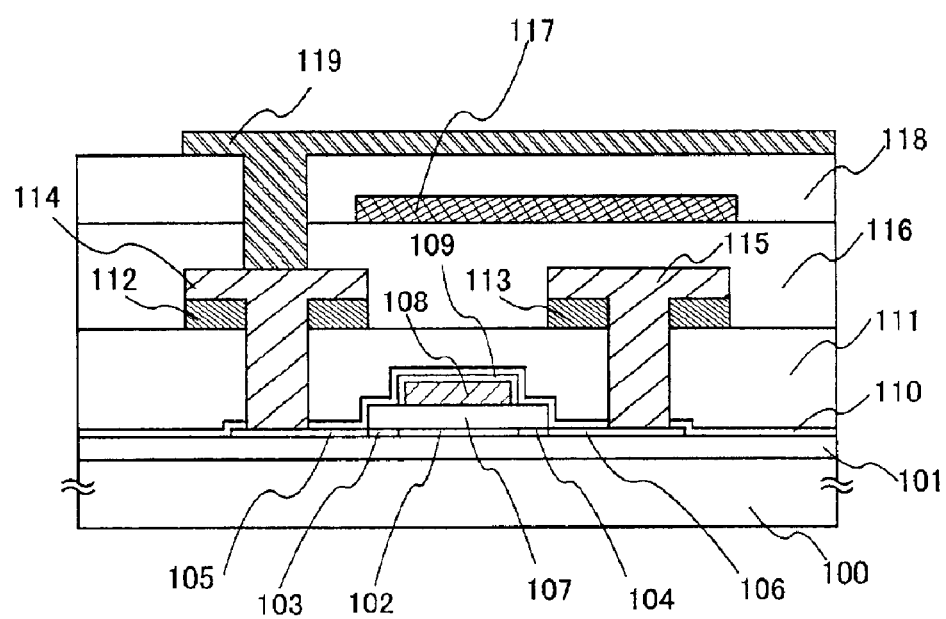
FIG. 1 is a view showing an example of the structure of the present invention.

An embodiment of the present invention is explained below with reference to FIG. 1.

A configuration of the present invention is characterized in that contact holes are formed by a dry etching method using a material composed of an organic material as an inter-layer insulating film to cover switching elements and each of the wirings, and a mask made of a metallic film.

Furthermore, in the configuration of the present invention, at least part of the wirings (112–115), which are present on the organic film, have a multi-layer configuration (the first metallic layer (the lower layer)/the second metallic layer (the upper layer)). Furthermore, the region where the first metallic layer (112, 113) is formed is at least of a multi-layer configuration. Moreover, the wirings inside the contact holes are not of a multi-layer configuration, but comprise the second metallic layer (114, 115), which are in contact with a source region 106 or a drain region 105 to be electrically coupled to each other.

In the configuration of the present invention, a conductive material is used as the first metallic layer (112, 113) or the second metallic layer (114, 115). For example, a material layer predominantly composed of Al, Ta, Ti, Cr, W, Mo, TiN, or the like, or a multi-layer film comprised thereof can be used. Furthermore, the first metallic layer is preferably made of a low resistance material such as aluminum. On the other hand, the second metallic layer is preferably made of a material that does not diffuse from the contact interface due to heat treatment after deposition and has good coverage, for example, a material predominantly composed of titanium.

Next, a process for forming contact holes of the present invention is explained below with reference to FIG. 2 and FIG. 3.

Furthermore, the present invention is applicable to any configuration of an insulating substrate, respective wirings fabricated on said insulating substrate, or semiconductor elements (TFT), which are present under inter-layer insulating films (111, 116, 118) composed of organic materials. For example, the configuration may be of a top gate type (planar type, coplanar type, or staggered type) or a bottom gate type (channel etching type or channel stop type).

To cover the entire surface of the substrate, the first flat inter-layer insulating film 111 is deposited which is composed of an organic material such as polyimide, polyimideamide, polyamide, acrylics, or BCB (benzocyclobutane). Furthermore, these organic resin materials may be heat-curing or photo-curing materials. The first inter-layer insulating film 111 is preferably provided, which has a film thickness ranging from 0.6 to 2 $\mu$m, in, order to reduce the parasitic capacitance produced between the respective signal wirings provided on different inter-layer insulating films. (FIG. 2(A)).

The first metallic film is formed on the resulting first inter-layer insulating film and is patterned using a resist mask 201. (FIG. 2(B)).

Thereafter, with the first patterned metallic film 204 employed as a mask, contact holes 202 and 203 are formed by dry etching. (FIG. 2(C)) In this step, the resist mask 201 can be removed at the same time the contact holes are formed. When Al, Ti, Cr, W, or TiN is used in the first metallic film, etching may be performed using a chlorine-based etchant gas. When Ta is used in the first metallic film, etching may be performed using a fluorine-based etchant gas. Furthermore, the present invention is characterized in that the first metallic film used as a mask in a subsequent process is patterned again and is used as part of the wirings.

In the present invention, the configuration of the TFT is not limited to that shown in FIG. 1. The present invention can be readily applied, for example, even to a configuration having an inversely staggered TFT or a silicide structure, as is required.

In addition, in this specification, the dry etching method is employed to remove the inter-layer insulating films composed of a resin material, and a chloride-based, fluorine-based, or an oxygen may be used as an etchant gas as appropriate.

The chloride-based etchant gas referred to in this specification denotes a gas containing chlorine or part chlorine, for example, a single gas or a mixed gas such as $Cl_2$, $BCl_3$, $SiCl_4$, HCl, or $CCl_4$, or a gas obtained by diluting the single gas or the mixed gas with a gas that contains no chlorine (such as $H_2$, $O_2$, or $N_2$).

The fluorine-based etchant gas referred to in this specification denotes a gas containing fluorine or part fluorine, for example, a single gas or a mixed gas such as $F_2$, $BF_3$, $SiF_4$, HF, or $CF_4$, or a gas obtained by diluting the single gas or the mixed gas with a gas that contains no chlorine (such as $H_2$, $O_2$, or $N_2$).

The semiconductor devices and the method for fabricating them are further explained in detail below with the embodiments shown below.

Embodiments

The embodiments of the present invention are explained below, however, it is a matter of course that the present invention is not limited to these embodiments.

Embodiment 1

This embodiment is explained referring to FIG. 1, which shows a cross-sectional structure of a semiconductor element of the present invention, fabricated on an insulating substrate.

Referring to the drawing, reference number 100 denotes a substrate and 101 denotes an underlying film. In addition, reference number 102 denotes a channel forming region, 103 and 104 denote low concentration impurity regions, 105 denotes a drain region, 106 a source region, 107 a gate insulating film, 108 a gate wiring, 109 an anode oxide film, and 110 a passivation film. Moreover, reference number 111 denotes an organic material film (a first inter-layer insulating film), 112 and 113 denote first metallic layers, 114 and 115 second metallic layers, 116 denotes an organic material film (a second inter-layer insulating film), and 117 a black mask. Still moreover, reference number 118 denotes an organic material film (a third inter-layer insulating film) and 119 a pixel electrode.

The wirings (112 to 115) have a multi-layer configuration comprising the first metallic films (112, 113) disposed in contact with the organic material films and the second metallic films (114, 115) disposed on said films. In addition, the wirings have a configuration in which only the second metallic films (114, 115) are deposited in contact with the inner wall portion and the bottom portion of the contact holes provided in the organic material films.

The first metallic and second metallic layers are not limited to any particular one so long as the layers have conductivity. For example, a material layer predominantly composed of Al, Ta, Ti, Mo, W, or Cr, or a multi-layer film composed thereof can be used. In this embodiment, a material predominantly composed of Al was used as the first metallic film, thereby reducing the resistance of the wirings. Furthermore, a material predominantly composed of Al would have no problem when deposited into a flat surface. However, when a sputtering method was employed for deposition at a region having projections and depressions on the surface, the sputtering would provide inferior coverage on the projections and depressions. Moreover, aluminum may diffuse into a semiconductor layer from contact interfaces, so that forming a layer in contact with the semiconductor layer (such as silicon) is avoided.

Accordingly, this embodiment employed titanium nitride (TiN) as the second metallic film. The titanium nitride is higher in resistivity than aluminum, but provides excellent coverage over the region with projections and depressions. Moreover, the titanium provided an excellent contact interface with the semiconductor layer (such as silicon).

Embodiment 2

In this embodiment, a process for fabricating a semiconductor element, in particular, a process for forming contact holes and wirings, on a substrate having insulating surfaces, is explained below with reference to FIG. 2 and FIG. 3.

First, the underlying film 101 is formed on the substrate 100 having insulating surfaces. A glass substrate, a quartz substrate, a ceramic substrate, or a semiconductor substrate can be used as the substrate. A glass substrate was used in this embodiment. The underlying film can employ a silicon oxide film, a silicon nitride film, or a silicon oxinitride film, 100 to 300 nm in thickness of the film. This embodiment employs TEOS as a raw material to form a silicon oxide film 200 nm in thickness. Furthermore, if sufficient flatness is available such as a quartz substrate, no underlying film need be necessarily provided.

Next, an active layer is formed on the substrate or the underlying film. The active layer may be made up of a crystalline semiconductor film (typically, a crystalline silicon film) 20 to 100 nm in thickness (preferably, 25 to 70 nm). Any known means may be used as the method for forming the crystalline silicon film. In this embodiment, the technique described in Japanese Patent Application No. 335152/1996 was used to form a film 50 nm in thickness.

The resulting crystalline silicon film is patterned to form an active layer and the gate insulating film 107. The gate insulating film can employ a silicon oxide film, a silicon nitride film, or a silicon oxinitride film, or a multi-layer film composed thereof in 100 to 300 nm in thickness. In this embodiment, a silicon oxinitride film was used as the gate insulating film 107 in a thickness of 150 nm by a plasma CVD method.

Next, aluminum or a material predominantly composed of aluminum was deposited by a sputtering method and patterned to form the gate wiring 108 (in this embodiment, a target containing 2 wt % scandium was used for deposition to form an aluminum film 400 nm in thickness).

Next, the technique described in Japanese Laid-Open Patent Publication No. 135318 of 1996 was used to dope an X III group element or an XV group element in order to form the source region 106, the drain region 105, the channel forming region 102, and LDD (lightly doped drain) regions 103 and 104. In this embodiment, the LDD regions 103 and 104, which are 0.5 to 1.5 $\mu$m in thickness (typically, 0.7 to 1 $\mu$m), were formed between the source region and the channel forming region. In addition, in this embodiment, the anode oxide film 109 was formed in contact with the gate wiring 108, but need not be necessarily formed.

Next, the impurity element doped to the active layer (the X III group or the XV group element) was thermally annealed or activated by laser beam radiation. In this embodiment, the excimer laser was used for the activation of the element and thereafter the element was further thermally annealed for two hours at a temperature of 450° C.

Figure 2A:
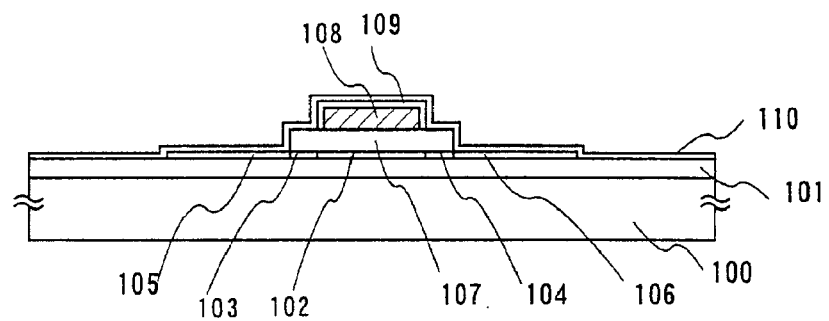
FIG. 2 is a view showing an example of the fabrication process of the present invention.
Figure 2B:
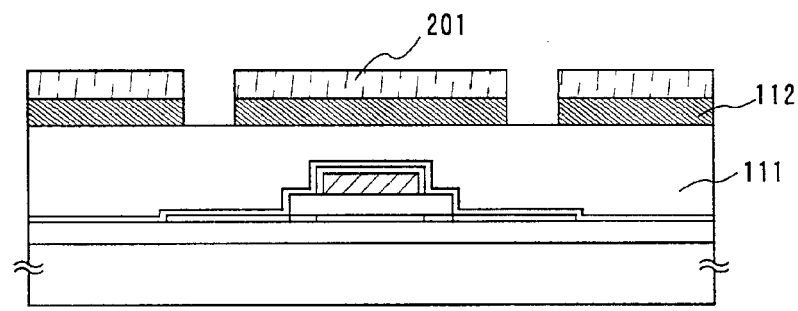
Figure 3A:
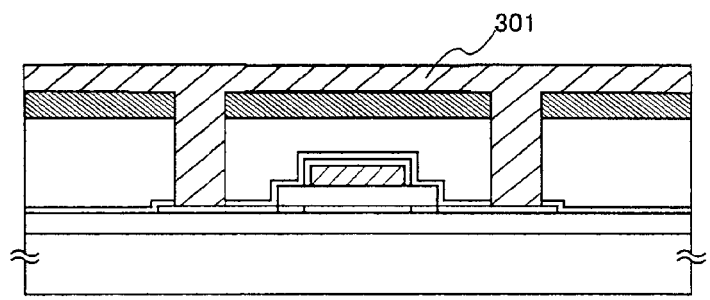
FIG. 3 is a view showing an example of the fabrication process of the present invention.

Thereafter, the passivation film 110 was formed to cover the entire surface of the substrate. The passivation film can employ a silicon nitride film or a silicon oxinitride film. In this embodiment the silicon nitride film, and a passivation film was formed in a thickness of 25 nm. Furthermore, FIG. 2(A) is a view showing the cross section after the passivation film has been formed.

Furthermore, an organic material film 0.5 to 3 $\mu$m in thickness was formed as the first inter-layer insulating film 111 to cover the entire surface of the substrate. As deposited method, the spin coating method using a spinner was used, and a coating with a flat surface was readily obtained. Subsequently, the film was baked by heating for one hour at a temperature of 250° C. In this embodiment, acrylic was used for depositing 1 $\mu$m in thickness. On the other hand, as a first inter-layer insulating film, it is possible to use polyimide, BCB (benzocyclobutane), or other organic material other than acrylic.

On the resulting first flat inter-layer insulating film, deposited was the first metallic film by the RF sputtering method. Thereafter, a resist was provided and then the first metallic film was patterned by means of dry etching. The dry etching was used to form the first metallic film 100 nm to 2 $\mu$m in thickness. In this embodiment, a metallic film predominantly composed of aluminum was deposited into a film 500 nm in thickness and dry-etched with a chlorine etchant gas. (FIG. 2(B)).

Next, the dry etching was performed using the patterned first metallic film as a mask to form the contact holes 202, and 203 in the first inter-layer insulating film. In this process, the resist composed of a material identical to the material of the first inter-layer insulating film is also removed at the same time. (FIG. 2(C)) Furthermore, in the case where the passivation film is provided, the etching is carried out again to remove the passivation film 110 to expose the semiconductor layers (106, 105) at the bottom of the contact holes. In this embodiment, the silicon nitride film or a passivation film was etched by anisotropic dry etching such as RIE (reactive ion etching). As the etchant gas, a fluorine-base gas, CHF$_3$, was used.

In addition, to reduce the number of processes, the first inter-layer insulating film and the passivation film are preferably etched at the same time using a mixed gas of CF$_4$, oxygen, and He.

Thereafter, a second metallic film 301 is deposited by means of the RF sputtering method. (FIG. 3(A)) In this process, contacts are formed in contact with the drain region 105 of said thin film transistor and the second metallic film at the bottom of the contact holes provided in the organic material films. The second metallic film has a thickness of 10 nm to 1 $\mu$m. In this embodiment, A TiN film was deposited in a thickness of 150 nm.

The first metallic layer or the second metallic layer is not limited to a particular material so long as the material of the film is conductive and a sputtering method can be applied to the material. For example, a material layer predominantly composed of Al, Ta, Ti, or Cr or a multi-layer film composed thereof can be employed. Furthermore, the first metallic layer and the second metallic layer may be formed with the same material.

Next, after patterning has been finished, the first metallic film and the second metallic film were etched by dry etching to form the electrodes pattern of the source and drain electrodes. In this embodiment, a chlorine-based etchant gas of 40 sccm/10 sccm/180 sccm of Cl$_2$/BCl$_3$/SiCl$_4$ was used for dry etching. (FIG. 3(B)).

The wirings (112 to 115) thus completed have a multi-layer structure comprising the first metallic film provided in contact with the organic material film and the second metallic film provided on said film. The wirings also have a configuration in which only the second metallic films (114, 115) are deposited in contact with the inner wall portion and the bottom of the contact holes provided in organic material film 111. In this embodiment, the first metallic films predominantly composed of aluminum were used, thereby reducing the resistance. In addition, the second metallic film predominantly composed of titanium was used for contacts, thereby allowing excellent contacts to be formed.

Then, the second inter-layer insulating film 116 is formed to cover the entire surface of the substrate. Furthermore, an organic material film is formed in a thickness of 0.5 to 3 $\mu$m as the second inter-layer insulating film. In this embodiment, acrylic was deposited again in a thickness of 1 $\mu$m. Ti was deposited thereon by the sputtering method as the black mask 117 and was patterned.

Thereafter, the third inter-layer insulating film 118 is formed to cover the entire surface of the substrate. Furthermore, an organic material film is formed in a thickness of 0.5 to 3 $\mu$m as the third inter-layer insulating film. In this embodiment, acrylic was deposited again in a thickness of 1 $\mu$m.

Contact holes are formed in the aforementioned second inter-layer insulating film and the third inter-layer insulating film to establish electrical connection to the drain electrode.

This process is performed by means of dry etching using a fluorine-based etchant gas. In this embodiment, 5 sccm/95 sccm/40 sccm of $CF_4/O_2/He$ was used for dry etching. Furthermore, as in this embodiment, forming the first inter-layer insulating film, the second inter-layer insulating film, and the third inter-layer insulating film with the same material prevents stress, thereby allowing the respective inter-layer insulating films to be provided with excellent adhesion therebetween.

Then, a conductive film that will serve as the pixel electrode 119 was formed to electrically connect to the drain region 105 of the TFT via the wirings (112 to 115). (FIG. 3(C)) In this embodiment, the conductive film employed ITO to fabricate a transmissive liquid-crystal display device. However, it is also possible to use reflective electrodes such as Al or Ti for the pixel electrodes to fabricate a reflective liquid-crystal display device. The reflective electrodes such as Al or Ti may be formed using the sputtering method.

Figure 3B:
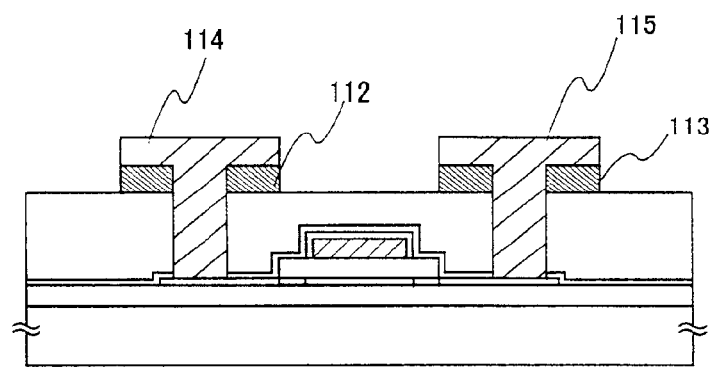
Figure 3C:
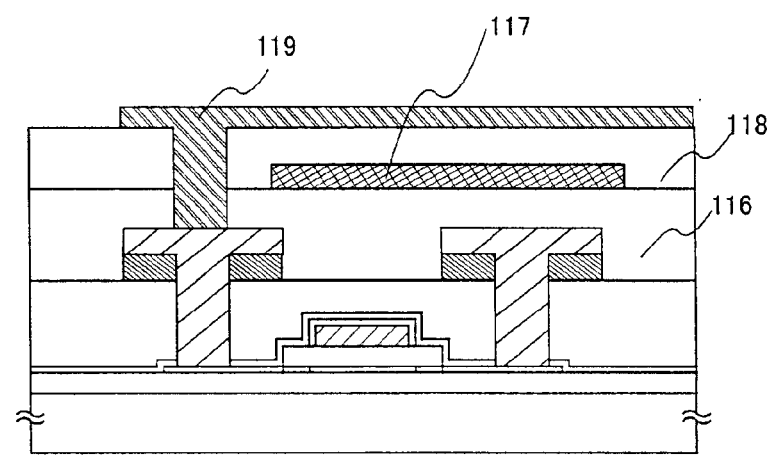

Through the fabrication processes described above, a switching element (FI) was completed which is used for applying voltage for controlling the liquid crystal to a pixel electrode, and thus a plurality of pixels were formed to complete an active matrix substrate with pixel matrix circuits. In each of the pixels in the pixel matrix circuits, at least one switching element and a first storage capacitor may be arranged. Furthermore, in this specification, the element formed in FIG. 3(B) is called a switching element (typically TFT but an MIM element may also be employed).

Furthermore, on the active matrix substrate, it is possible to form an drive circuit (a driver circuit) and a signal processing circuit (a γ correction circuit and a logic circuit such as a D/A converter), other than the pixel matrix circuits. The fabrication process of these circuits is in principle the same as those of this embodiment (in practice, the circuits are completed in FIG. 3(B)), and so detailed explanations are omitted.

In addition, the present invention relates to the forming steps of contact holes and the configuration of wirings. Thus, other elements (such as capacitance elements or memory elements) to be formed on the same substrate may take any configuration. The fabrication process and the configuration of such circuits may be determined by those involved as appropriate.

Embodiment 3

Figure 4:
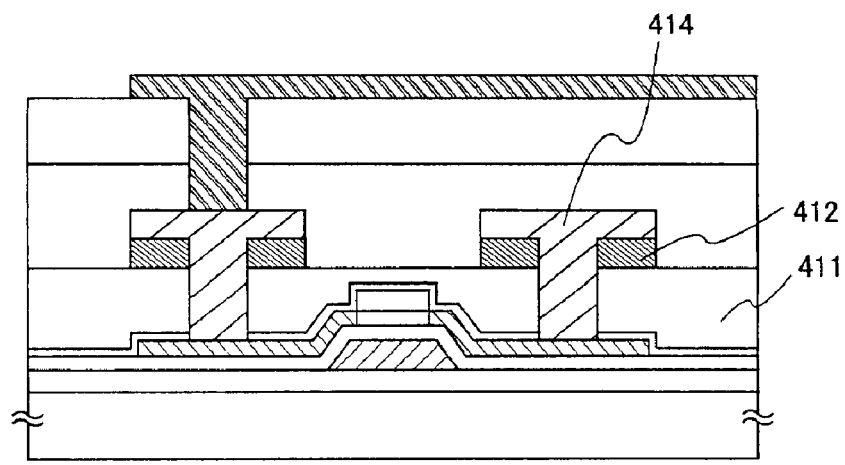
FIG. 4 is a view showing an example of the structure of the present invention.

This embodiment is an example of employing an inversely staggered TFT, the structure of which is shown in FIG. 4. The processes of this embodiment, which are different from those for fabricating inversely staggered TFTs by means of a known technique, are as follows. That is, the process in which an organic material is used for an inter-layer insulating film 411, the process in which contact holes are formed by dry etching using a metallic film as a mask, and the process in which wirings are formed which are constituted by a first metallic film 412 and a second metallic film 414. Furthermore, the structure of the TFT is not limited to the configuration (a channel stop type) shown in FIG. 4. The present invention can be readily applied even to such a structure, for example, as has a channel etch TFT or a silicide structure.

Embodiment 4

Figure 5:
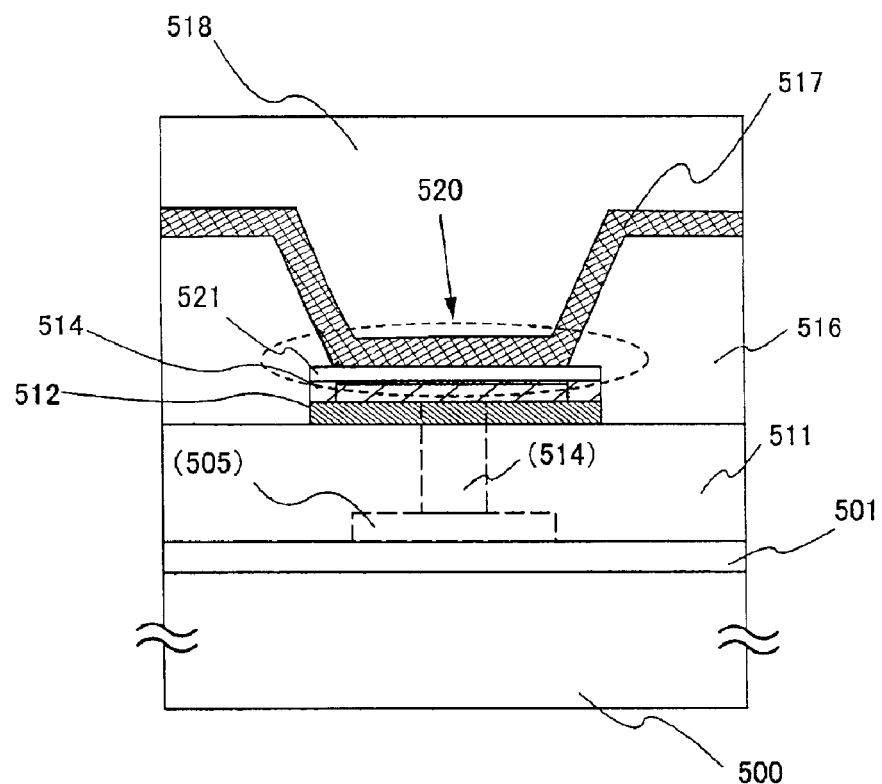
FIG. 5 is a view showing an example of the structure of the present invention.

This embodiment is an example in which a storage capacitor is formed at the same time a switching element is formed which is used for applying voltage for controlling the liquid crystal to a pixel electrode. FIG. 5 illustrates a cross section of a contact portion where a storage capacitor has been fabricated.

Figure 2C:
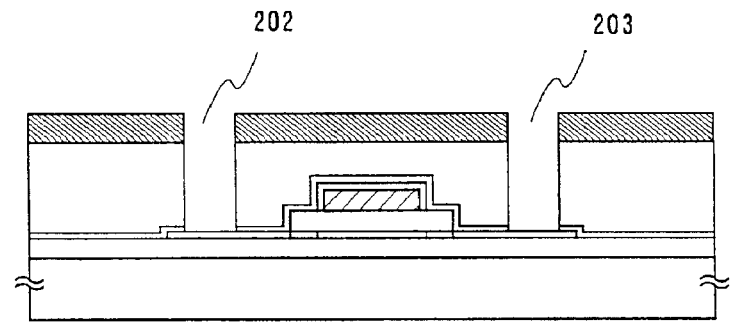

This embodiment can be implemented by the same processes as those in FIG. 2(C) of Embodiment 1 and so its description and drawings are omitted.

When an inorganic thin film fabricated by the CVD or the like is provided on an organic material film, it was conventionally difficult to obtain an excellent film because of moisture or a gas such as methane produced from an organic material film if the organic material was exposed on the surface thereof.

In this embodiment, after the same state as that in FIG. 2(C) of Embodiment 2 has been reached, then the second metallic film was deposited by the sputtering method to cover the entire surface of the substrate to completely eliminate portions where the organic material is exposed in order to prevent the aforementioned gas from developing. Thereafter, the inorganic thin film was deposited successively by the CVD method. The inorganic thin film was deposited in a thickness ranging from 10 through 100 nm using the plasma CVD method. In this embodiment, a silicon oxinitride film was deposited in a thickness of 50 nm. The inorganic thin film may be of a single layer or of a multi-layer configuration with two layers or more, for example, a silicon nitride film (lower layer)/silicon oxide film (upper layer).

Next, patterning is carried out to form wirings 512 and 514 the upper surface of which is covered with an inorganic film 521. Then, a second inter-layer insulating layer 516 was formed to cover the entire surface of the substrate and thereafter was provided with a recess only on the portions constituting a storage capacitor 520. The second inter-layer insulating film may be of a single layer or of a multi-layer configuration with two layers or more.

In this embodiment, as the second inter-layer insulating layer, an insulating layer is used which is composed of an acrylic film (1 μm). In place of acrylic, other organic material such as polyimide or BCB (benzocyclobutane) may be used.

Then, to form a recess, the acrylic film is provided with an opening by means of the dry etching method. At this time, the silicon nitride film 521 functions as an etching stopper. This will cause the silicon nitride film to remain at the bottom of the recess. In this embodiment, this silicon nitride film 521 is used as a dielectric body of the storage capacitor. As a matter of course, the wet etching may be used. Alternatively, the acrylic film may be half etched to form the recess in order to use the portion of the thin film as the dielectric of the storage capacitor.

After the recess has been formed in the second inter-layer insulating layer, a black mask is formed. In this embodiment, the black mask 517 employs titanium, and may employ other metals such as chromium or tantalum.

Under this condition, with the drain electrodes 512 and 514 and the black mask 517 employed as the upper and lower electrodes, the storage capacitor 520 with the second inter-layer insulating layer 521 (precisely speaking, a silicon nitride film) employed as the dielectric body is formed. (FIG. 5).

As such, the storage capacitor 520 was formed at the same time the switching element (TFF) was formed which is used for applying voltage for controlling the liquid crystal to a pixel electrode.

Moreover, each of the aforementioned inter-layer insulating films made of the organic material in each of the aforementioned examples may be of a single layer or of a multi-layer configuration with two layers or more.

Furthermore, this embodiment can be freely combined with any one of the configurations of Embodiment 1 through Embodiment 3.

Embodiment 5

This embodiment of the present invention is explained with reference to FIG. 6 through FIG. 10. Here, a method for fabricating, on the same substrate simultaneously, a pixel circuit and a drive circuit for driving the pixel circuit. However, for simplicity of explanation, a CMOS circuit that is a basic circuit for a shift register circuit, a buffer circuit, or the like, and a n-channel type TFT that forms a sampling circuit are to be illustrated.

In FIG. 6(A), a substrate 601 desirably employs a quartz substrate or a silicon substrate. This embodiment employed a quartz substrate. Alternatively, such a substrate may be used as is provided with an insulating film on the surface of a metallic substrate or a stainless steel substrate. This embodiment requires the heat resistance to resist a temperature of 800° C. or more, and thus any substrate that satisfies the heat resistance may be used.

Then, on the surface of the substrate 601 on which the TFT is to be formed, a semiconductor film 602 containing an amorphous structure is formed in a thickness ranging from 20 through 100 nm (preferably, 40 through 80 nm) by means of the low-pressure thermal CVD method, the plasma CVD method, or the sputtering method.

Moreover, the semiconductor film containing an amorphous structure includes an amorphous semiconductor film and a fine crystalline semiconductor film as well as a compound semiconductor film containing an amorphous structure such as an amorphous silicon germanium film. Still moreover, it is also effective to form the underlying film and the amorphous silicon film successively on the substrate without being exposed to the atmosphere. This enables preventing of any contamination on the surface of the substrate from exerting an effect on the amorphous silicon film, thereby enabling a reduction in variations in the property of the TFT fabricated.

Next, a mask film 603 comprised of an insulating film that contains silicon is formed on the amorphous silicon film 602 to form openings 604a and 604b by patterning. The openings are to be used as doping regions for doping catalytic elements to accelerate crystallization in the subsequent crystallization process. (FIG. 6(A)).

Furthermore, an insulating film containing silicon ban employ a silicon oxide film, a silicon nitride, and a silicon oxinitride film. The silicon oxinitride film is an insulating film containing predetermined amounts of silicon, nitrogen, and oxygen, which are expressed by SiOxNy. The silicon oxinitride film can be formed with $SiH_4$, $N_2O$, and $NH_3$ as raw material gases, and preferably contains nitrogen of a concentration ranging from 25 atomic % to 50 atomic %.

In addition, marker patterns, which are to be used as references for subsequent patterning, are best formed at the same time the mask film 603 is patterned.

Next, in accordance with the technique described in Japanese Laid-Open Patent Publication No. 247735 of 1998 (corresponding to U.S. Ser. No. 09/034,041), a semiconductor film containing a crystalline structure is formed. The technique described in the publication is a crystallization means using catalytic elements (one or a plurality of elements selected from a group consisting of nickel, cobalt, germanium, tin, lead, palladium, iron, and copper) to accelerate crystallization at the time of crystallization of the semiconductor film containing an amorphous structure.

More specifically, the technique is to perform heating treatment, with catalytic elements held on the surface of the semiconductor film containing an amorphous structure, to change the semiconductor film containing an amorphous structure into a semiconductor film containing a crystalline structure. Furthermore, as a means for crystallization, the technique described in Embodiment 1 of Japanese Laid-Open Patent Publication No. 130652 of 1995 may be used.

Moreover, the semiconductor film containing a crystalline structure includes a so-called single crystalline semiconductor film and a polycrystalline semiconductor film, however, the semiconductor film containing a crystalline structure, formed by the technique of the publication has crystalline grain boundaries.

Furthermore, the technique in the publication employs the spin coating method at the time of forming a layer containing catalytic elements on a mask film, however, means like a vapor phase method such as the sputtering method or the vapor deposition method may be used to deposit a thin film containing catalytic elements.

Furthermore, the amorphous silicon film, depending on the content of hydrogen, is preferably heated for about one hour at a temperature ranging from 400 through 550° C. to allow hydrogen to escape thoroughly so as to be desirably crystallized. In this case, the content of hydrogen is preferably 5 atomic % or less.

In the crystallization process, first, heat treatment is performed for about one hour at temperatures ranging from 400 through 500° C., then hydrogen is allowed to escape from inside the film, thereafter heat treatment is performed at temperatures ranging from 500 through 650° C. (preferably, from 550 through 600° C.) for 6 through 16 hours (preferably, for 8 through 14 hours).

In this embodiment, nickel is used as the catalytic element and undergoes heat treatment for 14 hours at a temperature of 570° C. This allows crystallization to proceed from the openings 604a and 604b in the directions (indicated by the arrows) substantially parallel to the substrate, so that semiconductor films 605a–605d (crystalline silicon films in this embodiment) are formed which contain crystalline structures with aligned macroscopic crystal growth directions. (FIG. 6(B)).

Next, a gettering process is performed to remove the nickel used in the crystallization process from the crystalline silicon film. In this embodiment, a process for doping an element of group XV (phosphorus in this embodiment) is performed using the mask film 603, which is previously formed, as a mask as it is in order to form phosphorus doping regions 606a and 606b (hereinafter referred to as gettering regions) containing phosphorus of a concentration of $1 \times 10^{19}$–$1 \times 10^{20}$ atoms/cm$^3$ on the crystalline silicon film exposed at the openings 604a and 604b. (FIG. 6(C)).

Next, a heat treatment process is performed in an atmosphere of nitrogen at temperatures ranging from 450 through 650° C. (preferably, 500 through 550° C.) for 4 through 24 hours (preferably, 6 through 12 hours). This heat treatment process causes the nickel in the crystalline silicon film to move in the directions indicated by the arrows and thus nickel is eliminated from inside the crystalline silicon film due to this gettering action. Accordingly, the concentration of nickel contained in crystalline silicon films 607a–607d after the gettering is reduced to $1 \times 10^{17}$ atoms/cm$^3$ or less, or preferably down to $1 \times 10^{16}$ atoms/cm$^3$.

Next, the mask film 603 is removed and a passivation film 608 is formed for use at the time of subsequent doping of an impurity on the crystalline silicon films 607a–607d. The passivation film 608 preferably employs a silicon oxinitride film or silicon oxide film 100 through 200 nm in thickness (preferably, 130 through 170 nm). This passivation film 608 is meant to prevent the crystalline silicon film from being exposed directly to plasma at the time of doping impurities and to enable delicate concentration control.

Then, a photoresist mask 609 is formed thereon and an impurity element of a p-type (hereinafter referred to as p-type impurity element) is doped via the passivation film

608. As the p-type impurity element, an element of group XIII, typically boron or gallium, can be used. The process (which is called the channel doping process) is a process for controlling the threshold voltage of TFT. Furthermore, boron is doped by the ion doping method, where diborane ($B_2H_6$) is excited in the state of plasma without mass separation. As a matter of course, an ion implantation method may be used, where mass separation is performed.

This process forms impurity regions 610a and 610b containing a p-type impurity element (boron in this embodiment) of a concentration of $1\times10^{15}$–$1\times10^{18}$ atoms/$cm^3$ (typically, $5\times10^{16}$–$5\times10^{17}$ atoms/$cm^3$. Furthermore, in this specification, an impurity region containing a p-type impurity element (the region not containing phosphorus) within the aforementioned range of concentration is defined as a p-type impurity region (b). (FIG. 6(D)).

Next, the resist mask 609 is removed and then the crystalline silicon film is patterned to form island-shaped semiconductor layers (active layers) 611–614. Furthermore, the active layers 611–614, crystallized by selective doping of nickel, are made of a crystalline silicon film with very good crystallinity. More specifically, the layers have a crystalline structure in which bar-shaped or pillar-shaped crystals are arranged with a specific directivity. In addition, after crystallization, nickel has been removed or reduced due to the gettering action of phosphorus, the concentration of the catalytic element remaining in the active layers 611–614 being $1\times10^{17}$ atoms/$cm^3$ or less, or preferably $1\times10^{16}$ atoms/$cm^3$. (FIG. 6(E)).

Furthermore, the active layer 611 of the p-channel type TFT is a region that contains no impurity elements intentionally doped, the active layers 612–614 of the n-channel type TFT being a p-type impurity region (b). In this specification, the active layers 611–614 in this state are defined to be intrinsic or substantially intrinsic. That is, a region where an impurity element is intentionally doped to such an extent that the doping will not produce an adverse effect on the operation of the TFT is safely considered a substantially intrinsic region.

Next, the plasma CVD method or the sputtering method is employed to form an insulating film containing silicon 10 through 100 nm in thickness. In this embodiment, a silicon oxinitride film 30 nm in thickness is formed. The insulating film containing silicon may be replaced with other single layer or multi-layer insulating films containing silicon.

Next, a heat treatment process is performed at temperatures within the range of 800 through 1150° C. (preferably, from 900 through 1000° C.) for 15 minutes to 8 hours (preferably, for 30 minutes through 2 hours) under an oxidizing atmosphere (the thermal oxidation process). In this embodiment, a heat treatment process is performed for 80 minutes at a temperature of 950° C. in an oxygen atmosphere mixed with 3 vol % hydrogen chloride. Furthermore, the boron doped in the process shown in FIG. 6(D) is activated during this thermal oxidation process. (FIG. 7(A)).

During this thermal oxidation process, an oxidation reaction also proceeds at the boundary interface between the insulating film containing silicon and the active layers 611–614 underlying the film. In the thermal oxidation process of this embodiment, 25 nm of the active layers 60 nm in thickness are oxidized to leave active layers 611–614 45 nm in thickness. In addition, the insulating film, containing silicon, 30 nm in thickness are added by a thermal oxidation film 50 nm in thickness, thereby finally leaving a gate insulating film 615 110 nm in thickness.

Next, resist masks 616–619 are newly formed. Then, an impurity element for providing an n-type (hereinafter referred to as an n-type impurity element) is doped to form impurity regions 620–622, which show an n-type. Furthermore, as an n-type impurity element, an element of group XV, typically phosphorus or arsenic can be used. (FIG. 7(B)).

The impurity regions 620–622 will function as an LDD region in an n-channel type TFT of a CMOS circuit or sampling circuit later. Furthermore, the impurity regions formed here include an n-type impurity element in a concentration of $2\times10^6$–$5\times10^{19}$ atoms/$cm^3$ (typically, $5\times10^7$–$5\times10^{18}$ atoms/$cm^3$). In this specification, an impurity region containing an n-type impurity element within the aforementioned range of concentration is defined as an n-type impurity region (b).

Furthermore, here, the ion doping method is employed to dope phosphorus of a concentration of $1\times10^{18}$ atoms/$cm^3$, where phosphine ($PH_3$) is excited in the state of plasma without mass separation. As a matter of course, the ion implantation method may also be employed in which mass separation is carried out. In this process, phosphorus is doped into the crystalline silicon film via the gate film 615.

Next, a heat treatment process is performed in an inactive atmosphere at temperatures within the range of 600 through 1000° C. (preferably, 700 through 800° C.) to activate the phosphorus doped in the process shown in FIG. 7(B). In this embodiment, the heat treatment is carried out in a nitrogen atmosphere at a temperature of 800° C. for one hour. (FIG. 7(C)).

At this time, it is also possible to simultaneously recover the active layers damaged at the time of doping the phosphorus, and the interface between the active layers and the gate insulating film. In this activation process, furnace annealing is preferably carried out using an electric heating furnace, however, optical annealing such as lamp annealing or laser annealing can be used together.

This process clearly defines the boundary portions of the n-type impurity regions (b) 620–622, that is, the junction portions with an intrinsic or a substantially intrinsic region (as a matter of course, including p-type impurity regions (b)), which are present around the n-type impurity regions (b). This means that the LDD region and the channel forming region will form a very good junction portion at the time the TFT is completed.

Next, a conductive film is formed which will become the gate wiring. Furthermore, the gate wiring may be formed with a single layer of a conductive film, however, it is preferably formed into a multi-layer film such as two layers or three layers of films as required. In this embodiment, a multi-layer film is formed which comprises a first conductive film 623 and a second conductive film 624. (FIG. 7(D)).

Here, as the first conductive film 623 and the second conductive film 624, an element selected from the group consisting of tantalum (Ta), titanium (Ti), molybdenum (Mo), tungsten (W), chromium (Cr), and silicon (Si), or a conductive film predominantly composed of said elements (typically, a tantalum nitride film, a tungsten nitride film, or a titanium nitride film), or an alloy film composed of said elements combined together (typically, a Mo—W alloy or a Mo—Ta alloy) can be used.

Furthermore, the first conductive film 623 may be 10 through 50 nm in thickness (preferably, 20 through 30 nm) and the second conductive film 624 may be 200 through 400 nm in thickness (preferably, 250 through 350 nm). In this embodiment, a tungsten nitride (WN) film 50 nm in thickness is used as the first conductive film 623, while a tungsten film 350 nm in thickness is used as the second conductive film 624. Furthermore, though not shown, a silicon film about 2 through 20 nm in thickness is effectively formed under the first conductive film 623.

Next, the first conductive film 623 and the second conductive film 624 are etched in a batch to form gate wirings 625–628 of a thickness of 400 nm. At this time, the gate wirings 626 and 627 that are formed in a drive circuit are formed so as to overlap part of the n-type impurity regions 620-622 via the gate insulating film 615. This overlapped portion will become a Lov region later. Furthermore, the gate wirings 628a and 628b look as if they are two patterns, however, they are formed with one continuously connected pattern. (FIG. 7(E)).

Next, a resist mask 629 is formed and a p-type impurity element (boron in this embodiment) is doped to form impurity regions 630 and 631 containing boron in a high concentration. In this embodiment, boron is doped in a concentration of $3 \times 10^{20}$–$3 \times 10^{21}$ atoms/cm$^3$ (typically, $5 \times 10^{20}$–$1 \times 10^{21}$ atoms/cm$^3$) by means of the ion doping method (as a matter of course, the ion implantation may be used) using diborane ($B_2H_6$). Furthermore, in this specification, an impurity region containing a p-type impurity element within the range of the aforementioned concentration is defined as a p-type impurity region (a). (FIG. 8 (A)).

Next, the resist mask 629 is removed and then resist masks 632-634 are formed to cover the regions that are to be gate wirings and p-channel type TFTs. Then, an n-type impurity element (phosphorus in this embodiment) is doped to form impurity regions 635–641, which contain a high concentration of phosphorus. Here, the ion doping method (as a matter of course, the ion implantation method may be employed) is also employed using phosphine (PH$_3$), with the concentration of phosphorus in this region being $1 \times 10^{20}$–$1 \times 10^{21}$ atoms/cm$^3$ (typically, $2 \times 10^{20}$–$5 \times 10^{21}$ atoms/cm$^3$). (FIG. 8(B)).

Furthermore, in this specification, the impurity regions containing an n-type impurity element within the range of the aforementioned concentrations are defined as an n-type impurity region (a). In addition, the regions in which the impurity regions 635–641 are formed to include phosphorus or boron, which has been doped in the previous process. However, since a sufficiently high concentration of phosphorus is to be doped, it is not necessary to consider the effect of the phosphorus or the boron, which is doped in the previous process. Therefore, in this specification, the impurity regions 635–641 may be safely said to be an n-type impurity region (a).

Next, the resist masks 632–634 are removed to form a passivation film 642 including an insulating film containing silicon. The thickness may be 25 nm through 100 nm (preferably, 30 through 50 nm). In this embodiment, a silicon nitride film 25 nm in thickness is to be used.

Next, an n-type impurity element (phosphorus in this embodiment) is doped in a self-aligning manner with the gate wirings 625–628 employed as a mask. An adjustment is made so that the resulting impurity regions 643–646 are doped with the concentration (5 through 10 times the concentration of the boron doped in the aforementioned channel doping process, generally $1 \times 10^{16}$–$5 \times 10^{18}$ atoms/cm$^3$, typically $3 \times 10^{17}$–$3 \times 10^{18}$ atoms/cm$^3$) of phosphorus ½ through 1/10 (typically, 1/3 through 1/4) that of said n-type impurity regions (b). Furthermore, in this specification, an impurity region containing an n-type impurity element within the range of the aforementioned concentration (however, excluding a p-type impurity region (a)) is defined as an n-type impurity region (c). (FIG. 8(C)).

In this process, phosphorus is to be doped via an insulating film 105 nm in thickness (a multi-layer film of the cap film 642 and the gate insulating film 615) and the passivation film 642 will function as a mask. That is, an offset region with a length corresponding to the thickness of the passivation film 642 is to be formed.

Furthermore, in this process, phosphorus is doped into all impurity regions except the portions covered with the gate wirings in the concentration of $1 \times 10^{16}$–$5 \times 10^{18}$ atoms/cm$^3$. However, since the concentration is very low, the function of each impurity region will not be given an adverse effect. In addition, the n-type impurity regions (b) 643–646 have already been doped with boron in the concentration of $1 \times 10^{15}$–$1 \times 10^{18}$ atoms/cm$^3$ in the channel doping process. However, in this process, since phosphorus is doped in a concentration 5 through 10 times that of the boron contained in the p-type impurity regions (b), it may be safely considered that boron will give no adverse effect on the function of the n-type impurity regions (b) in this case as well.

Thereafter, a heat treatment process was carried out to activate the n-type or p-type impurity element doped in respective concentrations. This process can be performed using the furnace annealing method, the laser annealing method, or the lamp annealing method, or by a combination. In the case of the furnace annealing method, it may be carried out in an inactive atmosphere at temperatures ranging from 500 through 800° C., preferably, at temperatures ranging from 550 through 600° C. In this embodiment, the impurity element was activated by heat treatment at a temperature of 600° C. for four hours. (FIG. 8 (D)).

Furthermore, in this embodiment, the activation process is carried out with gate wirings covered with the silicon nitride film 642 stacked thereon. In this embodiment, the silicon nitride film is stacked, thereby enabling it to carry out the activation process at high temperatures without considering pinholes.

Next, after the activation process, heat treatment is carried out at temperatures ranging from 300 through 450° C. for 1 through 4 hours in an atmosphere containing 3 through 100% hydrogen in order to hydrogenate the active layers. This process is to terminate dangling bonds of semiconductor layers by means of hydrogen thermally excited. As an alternative means for hydrogenation, plasma hydrogenation may be carried out (using hydrogen excited by plasma).

After the activation process has been completed, a first inter-layer insulating film 650 500 nm through 1.5 μm in thickness is formed. In this embodiment, as the first inter-layer insulating film 650, an acrylic film 1 μm in thickness is formed by the coating method. Alternatively, as another first inter-layer insulating film 650, it is also possible to use an organic resin film such as polyimide, polyamide, polyimide-amide, or BCB (benzocyclobutane).

Thereafter, contact holes are formed to reach the source region or the drain region of respective TFTs. At this time, the sputtering method is employed to deposit a Ti film on the entire surface and thereafter a resist mask is used to form the contact holes to penetrate the Ti film and the organic resin film by the dry etching method. At the same time of the aforementioned dry etching, the resist mask is removed, then a film predominantly composed of aluminum is formed on the entire surface, and then patterning is carried out to form source wirings 651–654 and drain wirings 655–657. As such, the contact structure is implemented which is shown in the embodiments of the present invention.

Furthermore, the p-channel type TFT and the n-channel type TFT share the drain wiring 655 in order to form a CMOS circuit. In addition, though not shown, this wiring has a multi-layer film of a two-layer configuration in which a Ti film 200 nm in thickness and an aluminum film 500 nm in thickness containing Ti are formed in this embodiment. (FIG. 9(A)).

In addition, the hydrogenation process may be further carried out thereafter. For example, heat treatment may be carried out in an atmosphere containing 3–100% hydrogen at temperatures within the range of 300 through 450° C. for 1 through 12 hours. Alternatively, the same effect can be obtained using the plasma hydrogenation method.

Thereafter, a second inter-layer insulating film 659 composed of an organic resin is formed in a thickness of about 1 μm. It is also possible to use an organic resin film such as polyimide, acrylics, polyamide, polyimide-amide, or BCB (benzocyclobutane) as the organic resin. The advantages of using an organic resin film are that the deposition method is simple, the specific dielectric constant is low, whereby the parasitic capacitance can be reduced, and the organic resin film provides outstanding flatness. Furthermore, organic resin films other than those mentioned above or an organic-based SiO compound can be used. Here, a thermally polymerized polyimide was formed by being applied on a substrate and baked at a temperature of 300° C.

Next, a blocking film 660 is formed on the second inter-layer insulating film 659 in a region that will become a pixel circuit. Furthermore, in this specification, the word "blocking film" is used to mean to block light or electromagnetic waves. The blocking film 660 is made of an element selected from a group consisting of aluminum (Al), titanium (Ti), and tantalum (Ta), or is a film predominantly composed of any one of the elements, being formed in a thickness of 100 through 300 nm. In this embodiment, an aluminum film containing 1 wt % titanium is formed in a thickness of 125 nm.

Furthermore, formation of an insulating film, 5 through 50 nm in thickness, such as a silicon oxide film on the second inter-layer insulating film 659 allows for improving the adhesion of the blocking film to be formed thereon. Moreover, application of plasma treatment to the surface of the second inter-layer insulating film 659 comprised of an organic resin with a $CF_4$ gas will improve the quality of the surface and thus allow for improving the adhesion of the blocking film to be formed thereon.

Moreover, it is possible to form not only the blocking film but also the connecting tracing, using the aluminum film that contains titanium. For example, it is possible to form connecting wirings that connect between circuits in the drive circuitry. However, in this case, it is necessary to form contact holes in the second inter-layer insulating film in advance before a material for forming the blocking film or the connecting wirings is deposited.

Next, an oxide 661 of a thickness of 20 through 100 nm (preferably, 30 through 50 nm) is formed on the surface of the blocking film 660 by means of the anodic oxidation method or the plasma oxidation method (the anodic oxidation method in this embodiment). In this embodiment, since a film predominantly composed of aluminum was used as the blocking film 660, an aluminum oxide film (an alumina film) was formed as the anode oxide 661.

Next, a contact hole is formed in the third inter-layer insulating film 659 and a passivation film 658 to reach a drain wiring 657 in order to form a pixel electrode 662. Furthermore, a pixel electrode 663 is a pixel electrode of another adjacent pixel. The pixel electrodes 662 and 663 safely employ a transparent conductive film for the transmissive liquid-crystal display device and a metallic film for the reflective liquid-crystal display device. Here, an indium tin oxide (ITO) film is formed in a thickness of 110 nm by means of the sputtering method in order to implement the transmissive liquid-crystal display device.

In addition, at this time, the pixel electrode 662 and the blocking film 660 overlap with each other via the anode oxide 661 to form a storage capacitor 664. Furthermore, in this case, it is desirable to set the blocking film 660 to a floating state (electrically isolated state) or a fixed potential, or preferably to a common potential (a midpoint potential of the image signals fed as data).

As such, an active matrix substrate has been completed which has a drive circuit and a pixel circuit on the same substrate. Furthermore, in FIG. 9(B), the drive circuit is provided with the p-channel type TFT 301 and n-channel type TFTs 802 and 803, while the pixel circuit is provided with a pixel TFT 804 comprised of an n-channel type TFT.

A process for fabricating an active matrix liquid-crystal display device from the active matrix substrate is explained here. An alignment film is formed on the substrate in the state shown in FIG. 9(B). In this embodiment, a polyimide film is used as the alignment film. In addition, the transparent conductive film and the alignment film 4 are formed as the facing substrate. Furthermore, as a facing substrate, a color filter or a blocking film may be formed as required.

Next, after the alignment film has been formed, rubbing is carried out so that the liquid crystal molecules are aligned with a certain pre-tilt angle. Then, the active matrix substrate, in which the pixel circuits and drive circuits have been formed, and the facing substrate are superimposed by a known cell assembly process using a sealing material or spacers (neither shown). Thereafter, liquid crystal is injected in between both substrates and then the substrates are completely sealed with a sealant (not shown). A known liquid crystal material can be used as the liquid crystal. As such, an active matrix liquid-crystal display device is completed.

Next, the structure of this active matrix liquid-crystal display device is explained with reference to the perspective view of FIG. 10. Furthermore, FIG. 8 uses the common reference numbers in order to correspond to the cross-sectional structural views of FIG. 1 through FIG. 4. The active matrix substrate comprises a pixel circuit 901, a scan (gate) signal drive circuit 902, and an image (source) signal drive circuit 903, which are all formed on the quartz substrate 601. A pixel TFT 804 of the pixel circuit is of the n-channel type TFT and the drive circuit provided on the surrounding is configured based on the CMOS circuit. The scan signal drive circuit 902 and image signal drive circuit 903 are connected to the pixel circuit 901 via the gate wiring 628 and source wiring 654, respectively. In addition, connecting wirings 906 and 907 are provided between an external I/O terminal 905 to which an FPC 904 is connected and the I/O terminal of the drive circuit.

Figure 10:
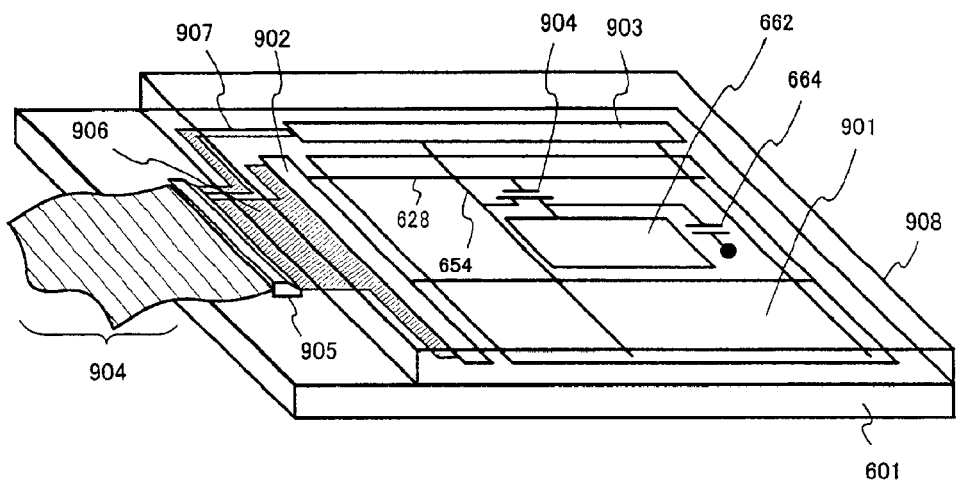
FIG. 10 is a view showing an example of the structure of the present invention.
Figure 11:
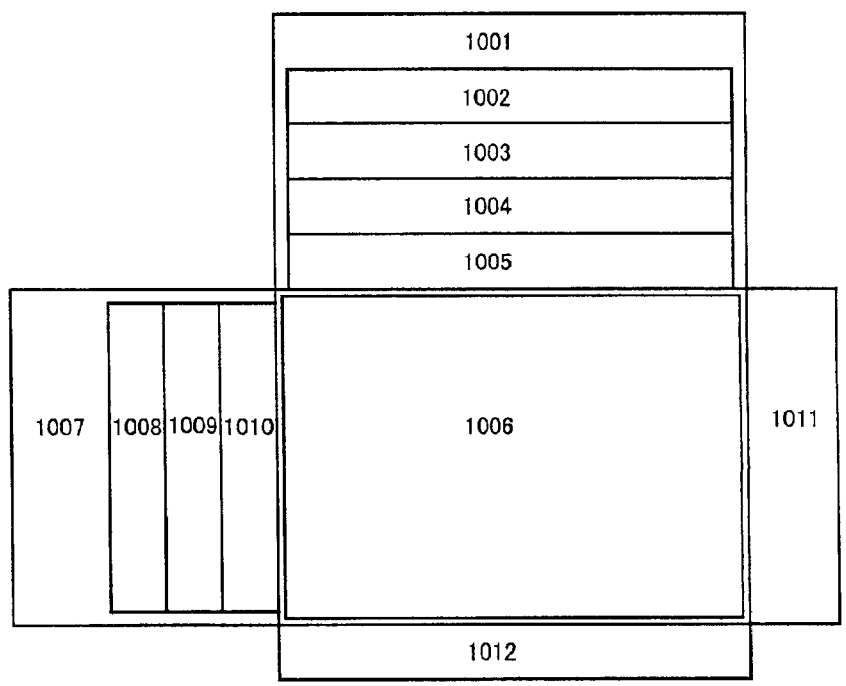
FIG. 11 is a view showing an example of the structure of the present invention.

Next, an example of the circuit configuration of the active matrix liquid-crystal display device shown in FIG. 10 is shown in FIG. 11. The active matrix liquid-crystal display device of this embodiment has an image signal drive circuit 1001, a scan signal drive circuit (A) 1007, a scan signal drive circuit (B) 1011, a pre-charge circuit 1012, and a pixel circuit 1006. Furthermore, in this specification, the drive circuit includes the image signal drive circuit 1001 and the scan signal drive circuit 1007.

The image signal drive circuit 1001 comprises a shift register circuit 1002, a level shifter circuit 1003, a buffer circuit 1004, and a sampling circuit 1005. In addition, the scan signal drive circuit (A) 1007 comprises a shift register circuit 1008, a level shifter circuit 1009, and a buffer circuit 1010. The scan signal drive circuit (B) 1011 has the same configuration.

Furthermore, the configuration of this embodiment can be readily implemented by fabricating the TFT in accordance with the process shown in FIG. 6 through FIG. 9. In addition, in this embodiment, only the configuration of the pixel circuit and drive circuit is shown. However, by following the fabrication processes of this embodiment, it is possible to form, on the same substrate, other circuits such as a signal divider circuit, a frequency divider circuit, a D/A converter circuit, an operational amplifier circuit, a γ correction circuit, and a signal processing circuit (which may be called a logic circuit) such as a microprocessor circuit.

As such, the present invention can implement a semiconductor device that includes at least a pixel circuit and a drive circuit for controlling said pixel circuit on the same substrate, for example, a semiconductor device comprising a signal processing circuit, a drive circuit, and pixel circuit on the same substrate.

Furthermore, by performing the processes up to that shown in FIG. 7(B) in this embodiment, a crystalline silicon film is formed which has a unique crystalline structure with continuity in the crystal lattice. For details on such crystalline silicon film, refer to Japanese Patent Application No. 044659/1998, Japanese Patent Application No. 152316/1998, Japanese Patent Application No. 152308/1998, or Japanese Patent Application No. 152305/1998, which are all applications by the present inventor. The outline of the features of the crystalline structure is explained for which the present applicant researched through experiments. Furthermore, these features coincide with those of the semiconductor layers forming the active layers of the TFT completed by this embodiment.

The aforementioned crystalline silicon film has a crystalline structure in which a plurality of needle-shaped or bar-shaped crystals (hereinafter referred to as a bar-shaped crystal) gather in an arrangement microscopically. This can be easily observed by TEM (Transmissive electron microscope).

The crystalline silicon film of this embodiment has an extremely small number of defects in the crystal grains and thus can be substantially considered to have no crystal grain boundaries. Accordingly, the crystalline silicon film can be considered a single crystal silicon film or a substantial single-crystal silicon film.

The configuration of this embodiment can be freely combined with any one of the configurations of Embodiments 1 through 4.

Embodiment 6

The present invention can be used to form an inter-layer insulating film on a conventional MOSFET and form a TFT thereon. That is, it is also possible to implement a three-dimensional semiconductor device. In addition, as the substrate, it is also possible to use an SOI substrate such as SIMOX, Smart-Cut (a trade mark of SOITEC), ELTRAN (a trade mark of CANON).

The configuration o this embodiment can be freely combined with any one of the configurations of Embodiments 1 through 5.

Embodiment 7

The present invention can be applied to and active matrix EL display device. Its embodiment is shown in FIG. 12.

Figure 12:
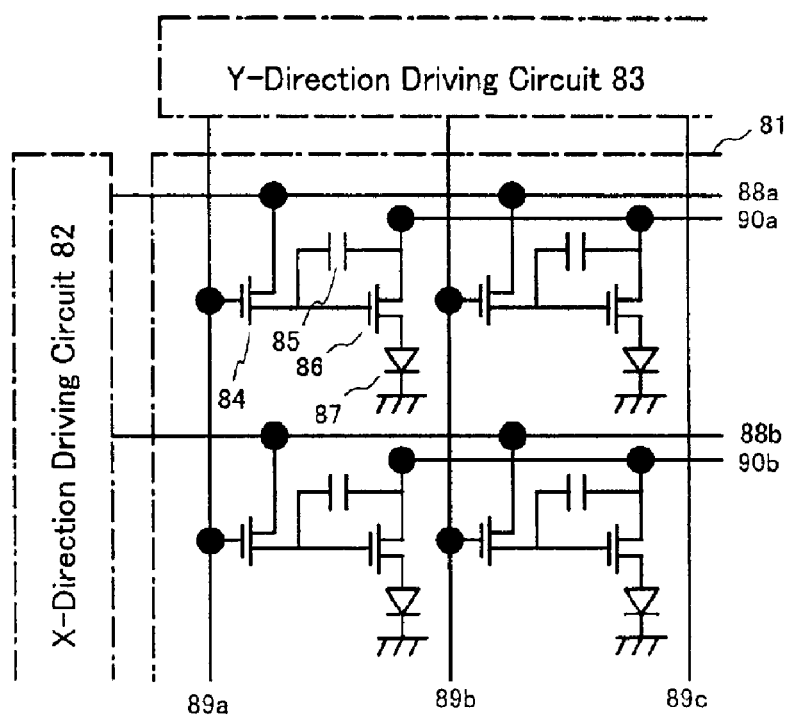
FIG. 12 is a figure showing a structure of an active matrix EL display device.

FIG. 12 is a circuit diagram of an active matrix EL display device. Reference number 81 denotes a pixel circuit around which there are provided an X-direction drive circuit 82 and a Y-direction drive circuit 83. Each pixel of the pixel circuit 81 has a switching TFT 84, a condenser 85, a current control TFT 86, and an organic EL element 87. An X-direction signal line 88a (or 88b) and Y-direction signal line 89a (or 89b or 89c) are connected to the switching TFT 84. In addition, the current control TFT 86 is connected with supply lines 90a and 90b.

In the active matrix EL display device of the present embodiment, the TFT that is used for the X-direction drive circuit 82, Y-direction drive circuit 83, and current control TFT 86 is formed by the combination of the p-channel type TFT 301 and the n-channel type TFT 302 or 303, shown in FIG. 9(B). Moreover, the TFT for the switching TFT 84 is formed by the n-channel type TFT 804 of FIG. 9(B).

Furthermore, any one of the configurations of Embodiments 1 through 6 may be combined to apply to the active matrix EL display device of this embodiment.

Embodiment 8

The liquid-crystal display device fabricated by the present invention can employ various types of liquid crystal materials. As such materials, available are TN liquid crystal, PDLC (Polymer Dispersion Liquid Crystal), FLC (Ferroelectric Liquid Crystal), AFLC (Anti-Ferroelectric Liquid Crystal), or a mixture of FLC and AFLC (Anti-Ferroelectric Mixed Liquid Crystal).

For example, "H. Furue et al.; Characteristics and Driving Scheme of Polymer-Stabilized Monostable FLCD Exhibiting Fast Response Time and High Contrast Ratio with Gray-Scale Capability, SID, 1988," "T. Yoshida et al.; A Full-Collar Thresholdless Antiferroelectric LCD Exhibiting Wide Viewing Angle with Fast Response Time, 841, SID97DIGEST, 1997," "S. Inui et al.; Thresholdless anti-ferroelectricity in liquid crystals and its application to displays, 671–673, J. Master. Chem. 6(4), 1996," or a material disclosed in U.S. Pat. No. 5,594,569 can be used.

In particular, some of threshold-less anti-ferroelectric LC (abbreviated as TL-AFLC) having an opto-electric response characteristic in that the transmittance varies successively to an electric field were found to show a V-shaped (or a U-shaped) opto-electric response characteristic with the drive voltage being about ±2.5V (1 through 2 μm in thickness of a cell). Accordingly, in some cases, the source voltage for the pixel circuit may be only 5 through 8V, indicating the possibility of operating the drive circuit and pixel circuit with the same source voltage. That is, the power consumption of the entire liquid-crystal display device can be reduced.

In addition, the ferroelectric liquid crystal and anti-ferroelectric liquid crystal has an advantage in that the response speed thereof is faster than that of the TN liquid crystal. The TFT used in the present invention can implement a TFT having a very fast operating speed. Thus, it is possible to implement a liquid-crystal display device that has a fast image response speed by making full use of the fast response speed of the ferroelectric liquid crystal and anti-ferroelectric liquid crystal.

Furthermore, in general, a non-threshold anti-ferroelectric mixed liquid crystal has a large degree of spontaneous polarization and the liquid crystal itself has a high dielectric constant. Accordingly, in the case of using this non-threshold anti-ferroelectric mixed liquid crystal in a liquid-crystal display device, pixels require a storage capacitor with comparatively high capacity. Therefore, it is preferable to use a non-threshold anti-ferroelectric mixed liquid crystal with less spontaneous polarization. From this point of view, the storage capacitor shown in FIG. 9(B) of Embodiment 5 is preferably able to accumulate high capacity with a low area.

Furthermore, the liquid-crystal display device of this embodiment can be effectively used, as a matter of course, for a display device of an electronic apparatus such as a personal computer.

In addition, the configuration of this embodiment can be freely combined with any one of the Embodiment 1 through Embodiment 7.

Embodiment 9

Figure 13A:
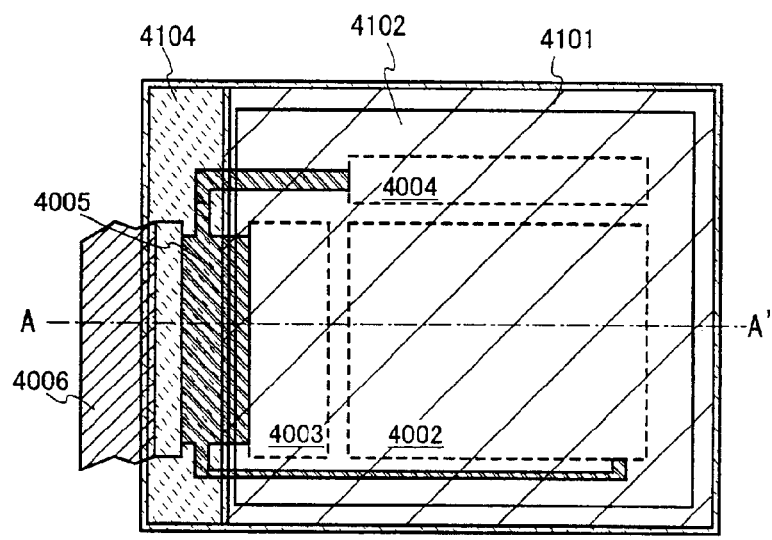
FIGS. 13A and 13B are a top view and a cross section, respectively, of an EL display device.

This Embodiment will be described with reference to an example of the case where an EL (electroluminescence) display device is fabricated by the use of the present invention. FIG. 13A is a top plan view of the EL display device according to the invention, and FIG. 13B is a sectional view thereof.

Referring to FIG. 13A, numeral 4001 denotes a substrate, numeral 4002 denotes a pixel portion, numeral 4003 denotes a source-side driving circuit, and numeral 4004 denotes a gate-side driving circuit, wherein the respective driving circuits lead to an FPC (Flexible Printed Circuit) 4006 via a wiring 4005 and is connected to an external apparatus.

In this case, a first sealing member 4101, a cover member 4102, a filling member 4103 and a second sealing member 4104 are provided in a state surrounding the pixel portion 4002, the source-side driving circuit 4003 and the gate-side driving circuit 4004.

Figure 13B:
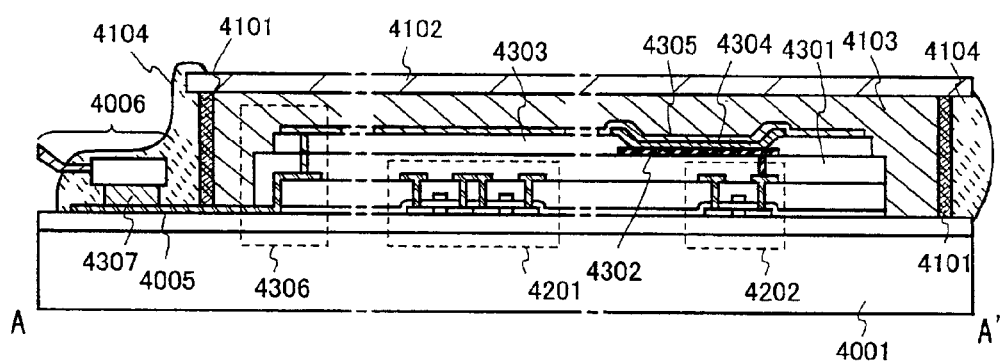

Further, FIG. 13B corresponds to a sectional view taken along the line A–A' in FIG. 13A, wherein, on the substrate 4001, there are formed a driving TFT (Here, however, an n-channel type TFT and a p-channel type TFT are shown) 4201 included in the source side driving circuit 4003 and a current controlling TFT (a TFT for controlling the current to the EL element) 4202 included in the pixel portion 4002.

In this Embodiment, as the driving TFT 4201, there are used TFTs of the same structure as that of the p-channel type TFT and the n-channel type TFT shown in FIG. 9, and, as the current controlling TFTs 4202, there is used a TFT of the same structure as that of the p-channel type TFT shown in FIG. 9. Further, in the pixel portion 4002, there is provided a capacitance storage (not shown) connected to the gate of the current controlling TFT 4202.

On the driving TFT 4201 and the pixel TFT 4202, there is formed an interlayer dielectric film (planarization film) 4301 composed of a resin material, and, formed on this interlayer dielectric film 4301 is a pixel electrode (anode) 4302 which is electrically connected to the drain of the pixel TFT 4202. As the pixel electrode 4302, a transparent conductive film which has a large work function is used. As the transparent conductive film, a compound of indium oxide and tin oxide or a compound of indium oxide and zinc oxide can be used.

Further, on the pixel electrode 4302, there is formed an insulation film 4303, which has an opening formed on the pixel electrode 4302. In this opening, an EL (electroluminescence) layer 4304 is formed on the pixel electrode 4302. As the material of the EL layer 4304, a known organic EL material or inorganic EL material can be used. Further, as organic EL materials, there are a low molecular (monomer) material and a high molecular (polymer) material, but either one can be used.

As the method of forming the EL layer 4304, the known evaporation technique or application technique may be used. Further, as for the structure of the EL layer, a hole injection layer, a hole transport layer, a light emitting layer, an electron transport layer or an electron injection layer may be freely combined into a stacked layer structure or a single-layer structure.

Formed on the EL layer 4304 is a cathode 4305 comprising a conductive film with light screening properties (typically, a conductive film composed mainly of aluminum, copper or silver or a stacked layer film comprising such film and another conductive film). Further, the water content and oxygen existing in the interface between the cathode 4305 and the EL layer 4304 should desirably be removed as much as possible. Accordingly, it is necessary to take a suitable measure such as the measure of continuously forming the El layer 4304 and the cathode 4305 in vacuum or the measure of forming the EL layer 4304 in a nitrogen or rare gas atmosphere and forming the cathode 4305 in a state kept from being touched by oxygen or water content. In this Embodiment, the above-mentioned film formation is made possible by the use of a multi-chamber type (cluster tool type) deposition apparatus.

The cathode 4305 is then electrically connected to the wiring 4005, in a region indicated by numeral 4306. The wiring 4005 is a wiring for applying a predetermined voltage to the cathode 4305 and electrically connected to the FPC 4006 through an anisotropic conductive film 4307.

In this way, an EL element comprised of the pixel electrode (anode) 4302, the EL layer 4304 and the cathode 4305 is formed. This EL element is surrounded by the first sealing member 4101 and the cover member 4102 bonded to the substrate 4001 by the first sealing member 4101 and is enclosed by a filling material 4103.

As the cover member 4102, a glass plate, a metal plate (generally a stainless steel plate), a ceramics plate, an FRP (Fiberglass-Reinforced Plastics) plate, a PVF (Polyvinyl Fluoride) film, a Mylar film, a polyester film or an acrylic film can be used. Further, there can also be used a sheet constituted in such a manner that an aluminum foil is sandwiched between PVF films or Mylar films.

However, in case the direction of the light radiated from the EL element faces the cover member side, the cover member must be made transparent. In this case, a transparent substance film such as a glass plate, a plastics plate, a polyester film or an acrylic film is used.

Further, as the filling material 4103, an ultraviolet-curing resin or a thermosetting resin can be used; PVC (polyvinyl chloride), acrylic, polyimide, epoxy resin, silicone resin, PVB (polyvinyl butyral) or EVA (ethylene vinyl acetate) can be used. In case a moisture absorbing substance (preferably barium oxide) is provided within this filling material 4103, the deterioration of the EL element can be suppressed.

Further, a spacer may be incorporated within the filling member 4103. In this case, if the spacer is formed of barium oxide, then it is possible to provide the spacer itself with moisture absorbing properties. Further, in case the spacer is provided, it is effective to provide a resin film on the cathode 4305 as a buffer layer for alleviating the pressure from the spacer.

Further, the wiring 4005 is electrically connected to the FPC 4006 through the anisotropic conductive film 4307. The wiring 4005 conducts to the FPC 4006 the signals sent to the pixel portion 4002, the source side driving circuit 4003 and the gate side driving circuit 4004 and is electrically connected to an external apparatus by the FPC 4006.

Further, in this Embodiment, the second sealing member 4104 is provided so as to cover the exposed portion of the first sealing member 4101 and a portion of the FPC 4006, whereby the EL element is thoroughly shut off from the outside air, thus constituting an EL display device having the sectional structure shown in FIG. 32B. The EL display device according to this Embodiment may be fabricated in combination with the constitution according to any of Embodiments 1 to 8.

Embodiment 10

Figure 14:
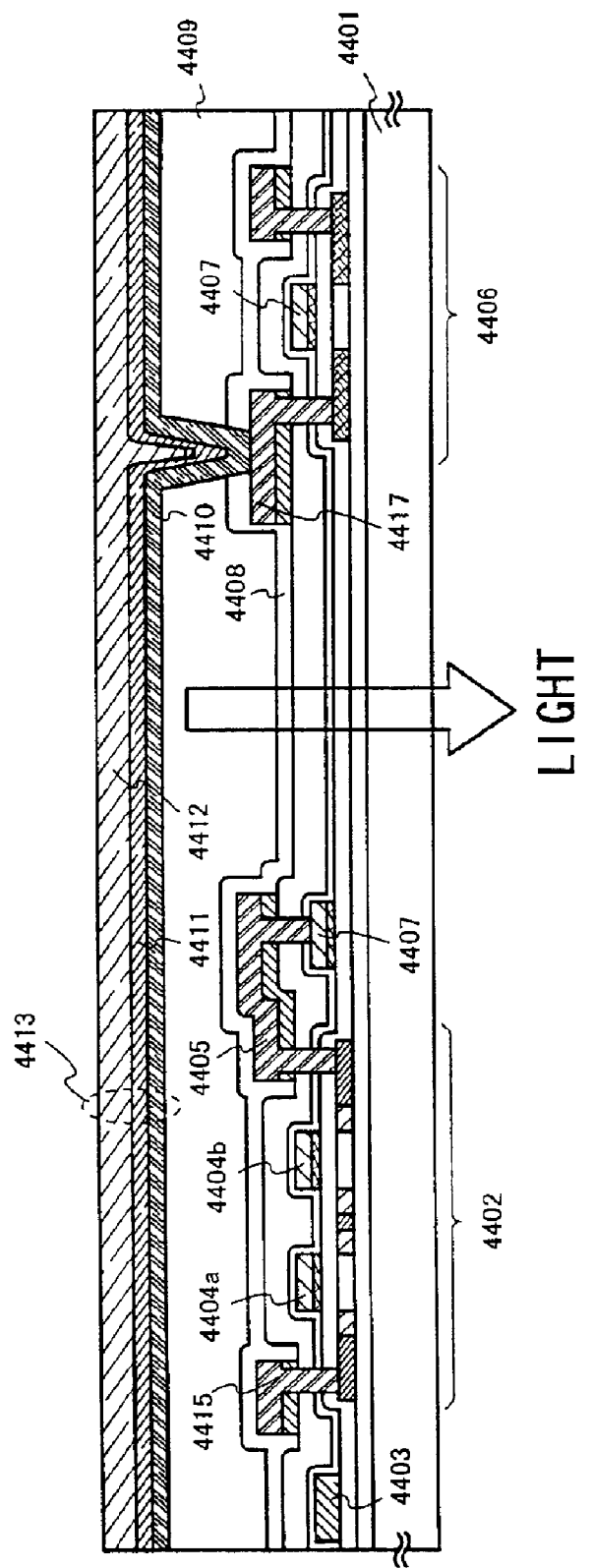
FIG. 14 is a figure showing a cross section of an EL display device.
Figure 15A:
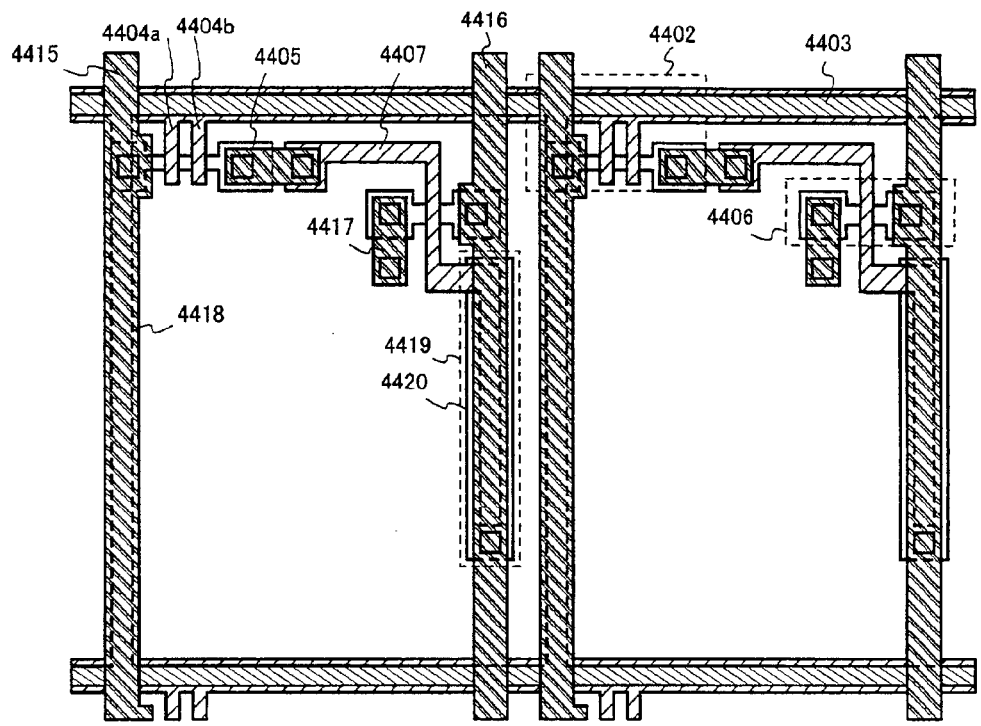
FIGS. 15A and 15B are figures of a top view and a circuit diagram of an EL display device.
Figure 15B:
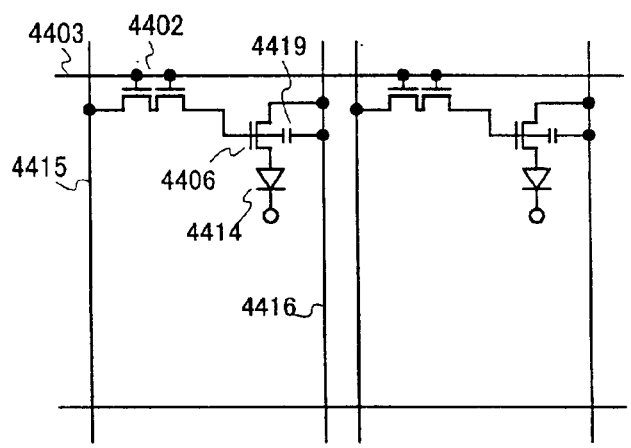

Here, FIG. 14 shows a further detailed sectional structure of the pixel portion, FIG. 15A shows the upper surface structure thereof, and FIG. 15B shows a circuit diagram thereof. In FIG. 14, FIG. 15A and FIG. 15B, common reference numerals are used, so that they may be referred to by one another.

Referring to FIG. 14, a switching TFT 4402 provided on a substrate 4401 is formed by the use of the n-channel type TFT shown in FIG. 9. Therefore, as the description of the structure, the description of the n-channel type TFT can be referred to. Further, the wiring indicated by numeral 4403 is a gate wiring which electrically connects the gate electrodes 4404a, 4404b of the switching TFT 4402.

In this Embodiment, the double gate structure in which two channel forming regions are formed is employed, but it may alternatively be the single gate structure in which one channel forming region is formed or the triple gate structure in which three channel forming regions are formed.

Further, a drain wiring 4405 of the switching TFT 4402 is electrically connected to a gate electrode 4407 of a current controlling TFT 4406. The current controlling TFT 4406 is formed by the use of the p-channel type TFT shown in FIG. 9. Therefore, as the description of the structure, the description of the p-channel type TFT can be referred to. In this Embodiment, the single gate structure is employed, but the double gate structure or the triple gate structure may alternatively be employed.

On the switching TFT 4402 and the current controlling TFT 4406, there is provided a first passivation film 4408, on which a planarization film 4409 composed of a resin is formed. It is very important to planarize, by the use of the planarization film 4409, the steps resulting from the TFTs. Since the EL layer which will be formed later is very thin, so that, due to the existence of such steps, defective light emission is caused in some cases. Therefore, it is desirable to perform planarization, before the formation of the pixel electrode, so that the EL layer can be formed as flat as possible.

Further, numeral 4410 denotes a pixel electrode (the anode of the EL element) comprising a transparent conductive film, and this pixel electrode 4410 is electrically connected to a drain wiring 4417 of the current controlling TFT 4406. As the pixel electrode 4410, there can be used a conductive film composed of a compound of indium oxide and tin oxide or a compound of indium oxide and zinc oxide.

On the pixel electrode 4410, an EL layer 4411 is formed. In case of FIG. 14, only one pixel is shown, but, in this Embodiment, EL layers corresponding to the respective colors, R (red), G (green) and B (blue), are made distinctly. Further, in this Embodiment, the EL layer 4411 is formed of a low-molecular organic EL material by the evaporation method. More specifically, there is employed the stacked layer structure constituted in such a manner that, as a hole injection layer, a copper phthalocyanine (CuPc) film is provided to a thickness of 20 nm, and, on this film, a tris-8-quinolinolato aluminum complex (Alq$_3$) film is provided. By adding fluorescent dyes to the Alq$_3$, the color of emitted light can be controlled.

However, what is stated above is an example of the organic EL materials which can be used for the EL layer, and therefore, this Embodiment need not be limited to the above-mentioned example at all. The EL layer (a layer for effecting light emission and the migration of the carriers therefor) may be formed by freely combining the light emitting layer, the charge transport layer or the charge injection layer. For example, in this Embodiment, an example of the case where a low-molecular organic EL material is used as the material of the EL layer is set forth, but a high-molecular organic EL material may be used instead. Further, as the material of the charge transport layer or the charge injection layer, an inorganic material such as silicon carbide can also be used. As these organic and inorganic EL materials, known materials can be used.

Next, on the EL layer 4411, a cathode 4412 comprising a light-screening conductive film is provided. In case of this Embodiment, an alloy film consisting of aluminum and lithium is used as the light-screening conductive film. Of course, a known MgAg film (an alloy film consisting of magnesium and silver) may be used instead. As the cathode material, there is used a conductive film composed of elements belonging to the group I or II of the periodic table or a conductive film to which these elements are added.

At the point of time when this cathode 4412 is formed, the EL element 4413 is completed. By the EL element 4413 mentioned here, the capacitor formed of the pixel electrode (anode) 4410, the El layer 4411 and the cathode 4412 is referred to.

Next, the upper surface structure of the pixel according to this Embodiment will be described by referring to FIG. 15A. The source of the switching TFT 4402 is connected to a source wiring 4415, and the drain thereof is connected to the drain wiring 4405. Further, the drain wiring 4405 is electrically connected to the gate electrode 4407 of the current controlling TFT 4406. The source of the current controlling TFT 4406 is electrically connected to a current supply line 4416, and the drain thereof is electrically connected to a drain wiring 4417. The drain wiring 4417 is electrically connected to a pixel electrode (anode) 4418 indicated by a dotted line.

In this case, in the region indicated by numeral 4419, a capacitance storage is formed. The capacitance storage 4419 is formed among a semiconductor film 4420 electrically connected to the current supply line 4416, an insulation film (not shown) which is the same layer constituting the gate insulating film, and the gate electrode 4407. Further, the capacitance constituted by the gate electrode 4407, the same layer (not shown) as the first interlayer dielectric film, and the current supply wiring 4416 can be also used as a capacitance storage.

Embodiment 10

This Embodiment will be described with reference to an EL display device which has a pixel structure different from that of Embodiment 10. For the description of this Embodiment, FIG. 16 will be used. Concerning the portions to which the same reference numerals are used as those used in FIG. 14, the description of Embodiment 10 can be referred to.

Figure 16:
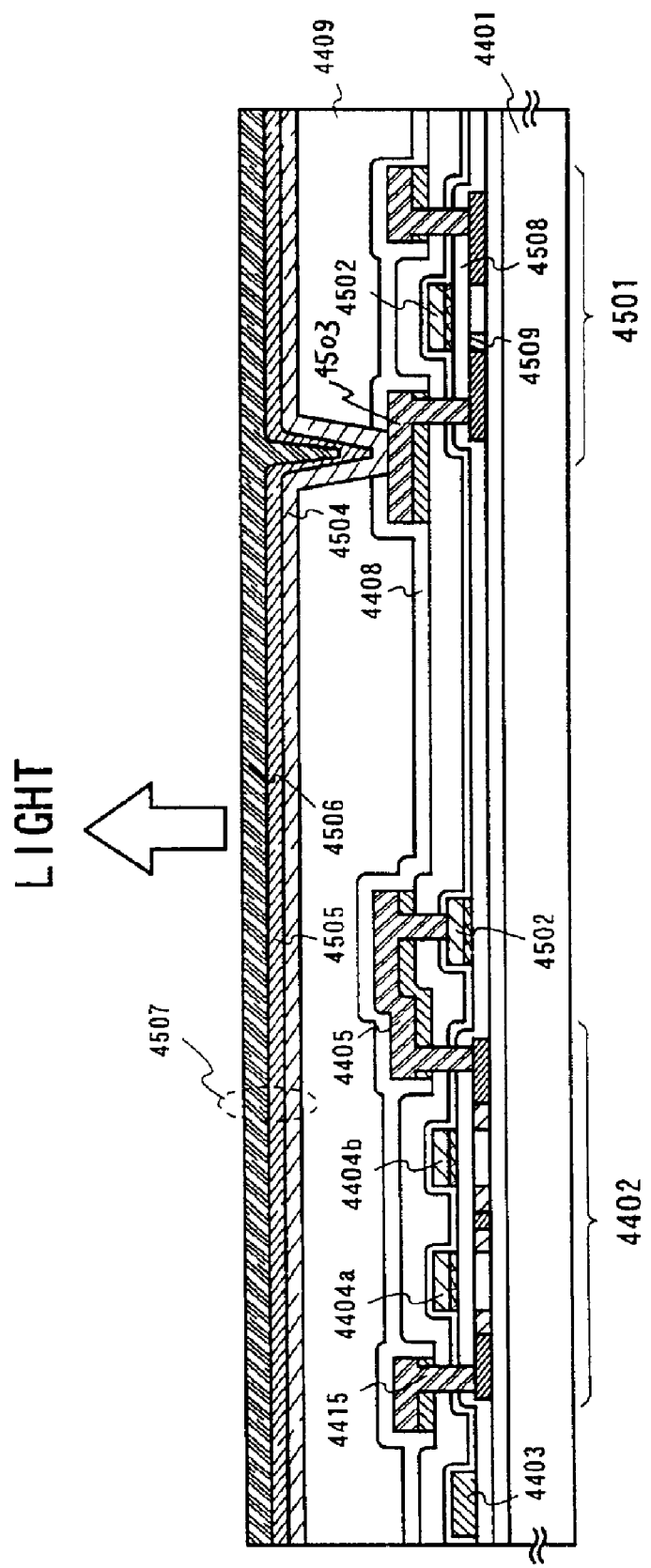
FIG. 16 is a figure showing a cross section of an EL display device.

In case of the structure shown in FIG. 16, a TFT having the same structure as the n-channel type TFT shown in FIG. 9 is used as a current controlling TFT 4501. Of course, a gate electrode 4502 of the current controlling TFT 4501 is connected to the drain wiring 4405 of the switching TFT 4402. Further, the drain wiring 4503 of the current controlling TFT 4501 is electrically connected to a pixel electrode 4504.

In this Embodiment, the pixel electrode 4504 functions as the cathode of the EL element and is formed by the use of a light-screening conductive film. More specifically, an alloy film consisting of aluminum and lithium is used, but a conductive film composed of elements belonging to the group I or II of the periodic table or a conductive film to which these elements are added may be used.

On the pixel electrode 4504, an EL layer 4505 is formed. In FIG. 16, only one pixel is shown, but, according to this Embodiment, an EL layer corresponding to G (green) is formed by the evaporation method and the application method (preferably, the spin coating method). More specifically, there is formed a stacked layer structure constituted in such a manner that a lithium fluoride (LiF) film with a thickness of 20 nm is provided as an electron injection layer, on which a PPV (polyparalphenylene vinylene) film with a thickness of 70 nm is provided as a light emitting layer.

Next, on the EL layer 4505, an anode 4506 comprising a transparent conductive film is provided. In case of this Embodiment, as the transparent conductive film, there is used a conductive film comprising a compound of indium oxide and tin oxide or a compound of indium oxide and zinc oxide.

At the point of time when this anode 4506 is formed, an EL element 4507 is competed. By the EL element 4507 mentioned here, the capacitor formed of the pixel electrode (cathode) 4504, the EL layer 4505 and the anode 4506 is referred to.

In case of that applied voltage to the EL element is high, for example 10V or more, the deterioration due to hot carrier effect becomes obvious in the current controlling TFT 4501. In such case, it is effective to apply the n-channel TFT having the structure of the present invention as the current controlling TFT 4501.

Further, the current controlling TFT 4501 according to this Embodiment is constituted in such a manner that a parasitic capacitance called gate capacitance is formed between the gate electrode 4502 and the LDD region 4509. By adjusting this gate capacitance, a function equal to the capacitance storage 4418 shown in FIGS. 15A and 15B can be provided. Particularly, in case the EL display device is operated in accordance with the digital driving method, the capacitance of the capacitance storage can be smaller than in case the EL display device is operated in accordance with the analog driving method, so that the capacitance storage can be substituted by the gate capacitance.

Incidentally, in case of that the applied voltage to the EL element is 10V or less, preferably 5V or less, the deterioration due to the hot carrier effect doesn't become obvious particularly. Therefore, the n-channel TFT having a structure that the LDD region 4509 was omitted in FIG. 16, can be applied.

Embodiment 12

Figure 17A:
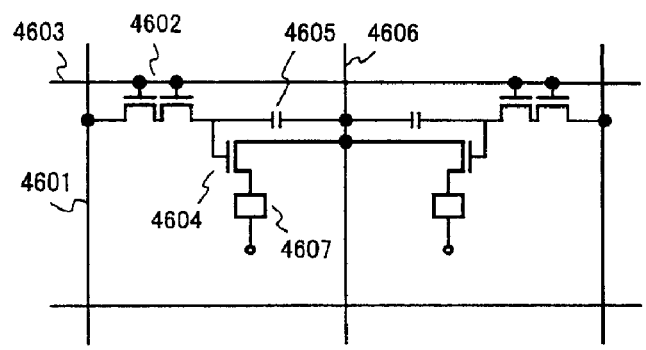
FIGS. 17A to 17C are figures showing circuit structure of pixel section of an EL display device.
Figure 17B:
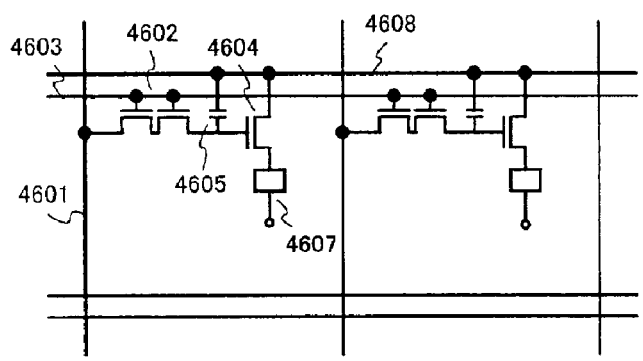
Figure 17C:
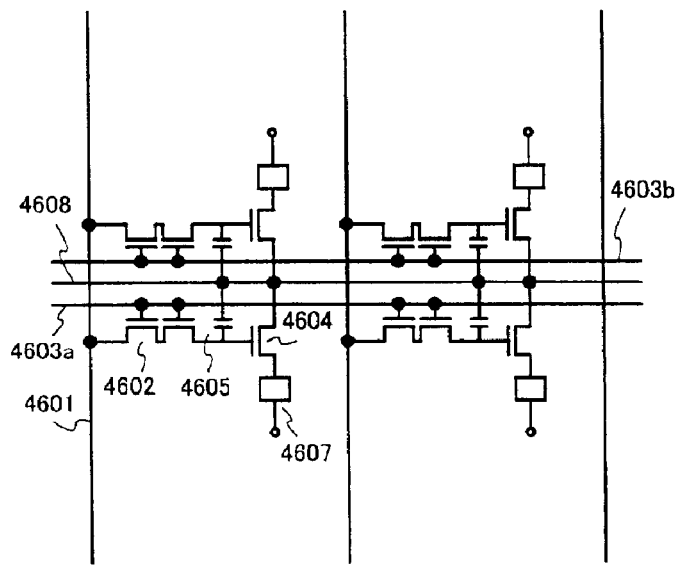

This Embodiment relates to examples of the pixel structure which can be applied to the pixel portion of the EL display device according to Embodiment 10 or 11; these examples are shown in FIGS. 17A to 17C. In this Embodiment, numeral 4601 denotes the source wiring of a switching TFT 4602, numeral 4603 denotes the gate wiring of the switching TFT 4602, numeral 4604 denotes a current controlling TFT, numeral 4605 denotes a capacitor, numerals 4606 and 4608 denote current supply lines, and numeral 4607 denotes an EL element.

FIG. 17A shows an example of the case where the current supply line 4606 is commonly used between two pixels. That is, the feature of this example lies in the point that the two pixels are formed so as to become line-symmetrical with reference to the current supply line 4606. In this case, the number of power supply lines can be reduced, so that the pixel portion can be made more minute and precise.

Further, FIG. 17B shows an example of the case where the current supply line 4608 is provided in parallel to the gate wiring 4603. In the structure shown in FIG. 36B, the current supply line 4608 and the gate wiring 4604 are provided so as not to overlap each other, but if they are wirings formed on different layers, then they can be provided so as to overlap each other through an insulation film. In this case, the occupied area can be used jointly by the power supply line 4608 and the gate wiring 4603, so that the pixel portion can be made further minute and precise.

The feature of the structure shown in FIG. 17C lies in the point that, as in case of the structure shown in FIG. 17B, the current supply line 4608 is provided in parallel to gate wirings 4603, and further, two pixels are formed so as to become line-symmetrical with reference to the current supply line 4608. Further, it is also effective to provide the current supply line 4608 so as to overlap one of the gate wirings 4603. In this case, the number of the power supply lines can be reduced, so that the pixel portion can be made further minute and precise.

Embodiment 13

Incidentally, the EL display device according to Embodiments 9 to 12, plural TFTs can be applied in one pixel. For example, three, six, or more TFTs can be applied. The present invention can be used not limited to the pixel structure of the EL display device.

Embodiment 14

The CMOS circuit and th e pixel portion manufactured according to the present invention can be applied to various electro optical devices (e.g. an active-matrix type liquid crystal display, an active-matrix type EL display and an active-matrix type EC display). That is, the present invention can be applied to all electronic apparatus in which these electro-optical devices are incorporated into the display portion.

Such as electronic apparatus includes video cameras, digital cameras, displays), car-navigations, car-stereos, personal computers and mobile-information terminals (mobile-computers, portable phones, or portable books). Some examples are shown in FIGS. 18, 19 and 20.

Figure 18A:
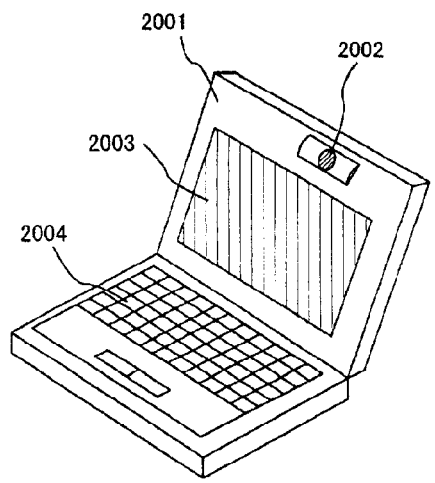
FIGS. 18A to 18F are examples of electronic devices.

FIG. 18A shows a personal computer which includes a main body 2001, an image-input portion 2002, a display portion 2003, and a keyboard 2004. The present invention can be applied to the image-input portion 2002, the display portion 2003, and other driving circuits.

Figure 18B:
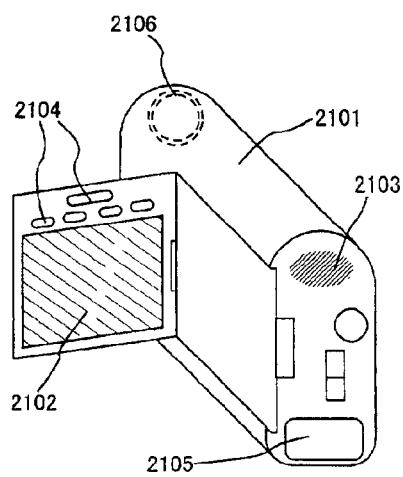

FIG. 18B shows a video camera which includes a main body 2101, a display portion 2102, a sound-input portion 2103, controlling switches 2104, a battery 2105, and an image-input portion 2106. The present invention can be applied to the display portion 2102 and other driving circuits.

Figure 18C:
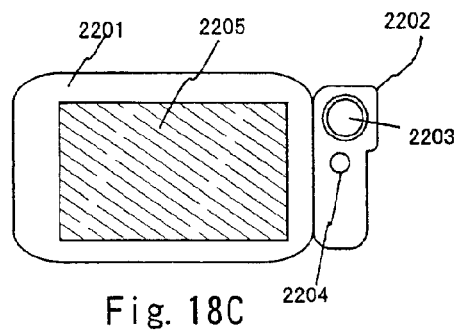

FIG. 18C shows a mobile-computer which includes a main body 2201, a camera portion 2202, an image-input portion 2203, controlling switches 2204, and a display portion 2205. The present invention can be applied to the display portion 2205 and other driving circuits.

Figure 18D:
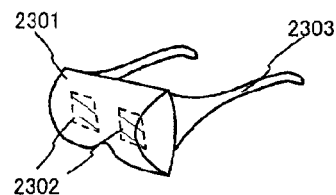

FIG. 18D shows a goggle-type display includes a main body 2301, a display portion 2302, and an arm portion 2303. The present invention can be applied to the display portion 2302 and other driving circuits.

Figure 18E:
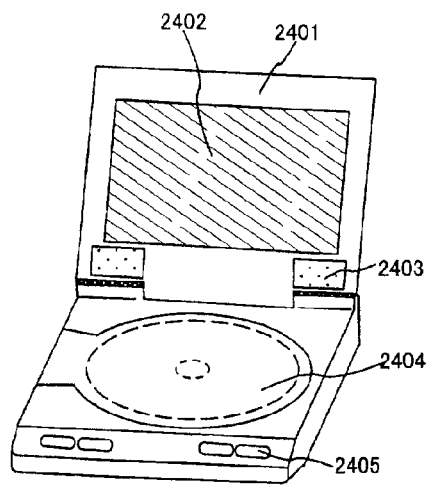

FIG. 18E shows a player by use of a recording medium recorded program, which includes a main body 2401, a display portion 2402, a speaker portion 2403, a recording medium 2404, and controlling switches 2405. Incidentally, music appreciation, film appreciation, games, and the use of the Internet can be performed with this device using a DVD (digital versatile disk), a CD, etc., as the recording medium. The present invention can be applied to the display portion 2402 and other driving circuits.

Figure 18F:
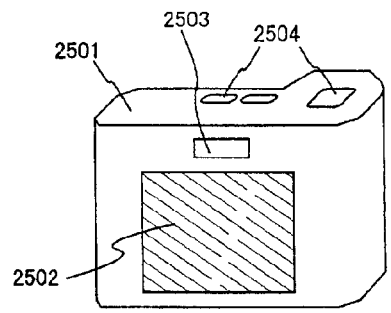

FIG. 18F shows a digital camera whish includes a main body 2501, a display portion 2502, an eye-contact portion 2503, controlling switches 2504, and an image-input portion (not shown). The present invention can be applied to the display portion 2505 and other driving circuits.

Figure 19A:
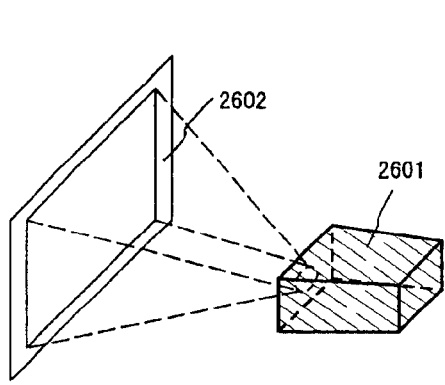
FIGS. 19A to 19D are examples of electronic devices.

FIG. 19A shows a front-type projector which includes a projector 2601 and a screen 2602. The present invention can be applied to a liquid crystal display device 2808 constituting a part of the projector 2601 and other driving circuits.

Figure 19B:
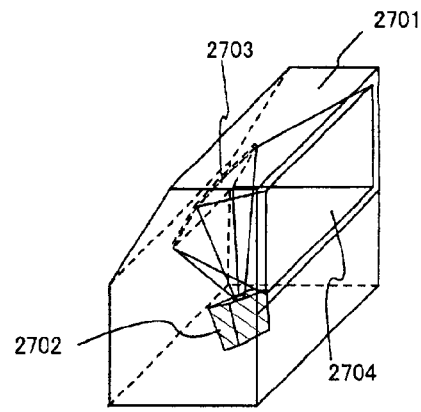

FIG. 19B is a rear-type projector which includes a main body 2701, a projector 2702, a mirror 2703, and a screen 2704. The present invention can be applied to a liquid crystal display device 2808 constituting a part of the projector 2702 and other driving circuit.

Figure 19C:
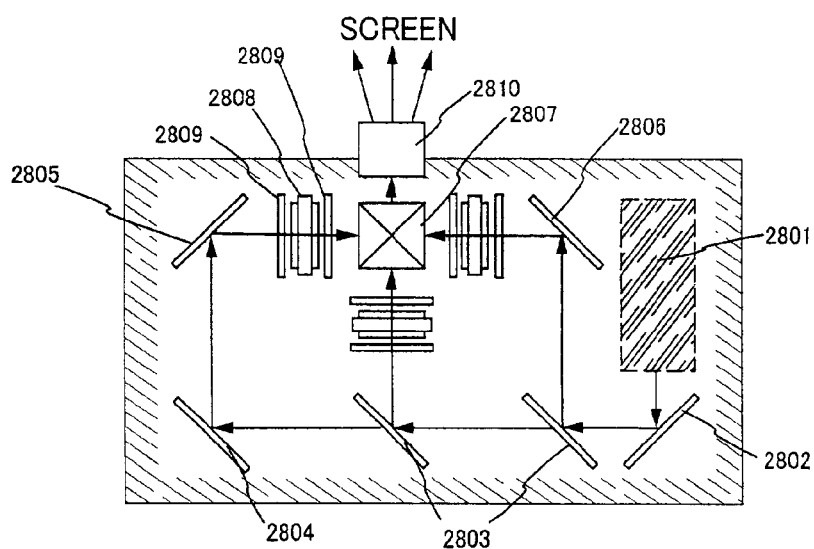

FIG. 19C shows an example of the structure of the projectors 2601 and 2702 in FIGS. 19A and 19B respectively. The projectors 2601 and 2702 each consist of an optical system for light source 2801, mirrors 2802, 2804-2806, a dichroic mirror 2803, a prism 2807, a liquid crystal display 2808, a phase difference plate 2809, and a projecting optical system 2810. The projecting optical system 2810 contains projector lenses. This example shows the one which contains three lenses. The one which has a single lens can also be possible. Incidentally, the example shown in FIG. 19C may be modified such that the arrowed optical paths can be provided with such optical elements as lenses, polarizing film, phase difference adjusting film, and IR film.

Figure 19D:
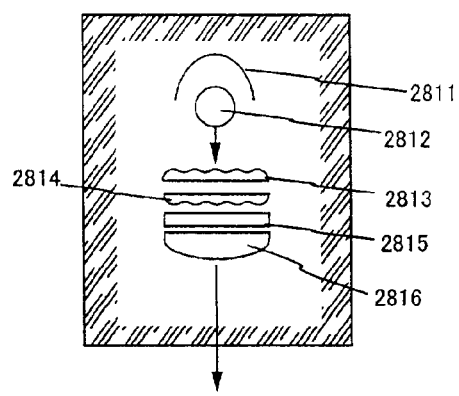

FIG. 19D shows an example of the structure of the light source optical system 2801 in FIG. 19C. The light source optical system 2801 consists of a reflector 2811, a light source 2812, lens arrays 2813 and 2814, a polarizing light converting element 2815, and a condenser lens 2816. Incidentally, the light source optical system shown in FIG. 19D is illustrative only but is not limitative. For example, the light source optical system can be provided with such optical elements as lenses, polarizing film, phase difference adjusting film, and IR film.

Although the projector of FIG. 19 shows an example of a transmission-type electro-optical device, examples of a reflection-type electro-optical device and an EL display device are not shown.

Figure 20A:
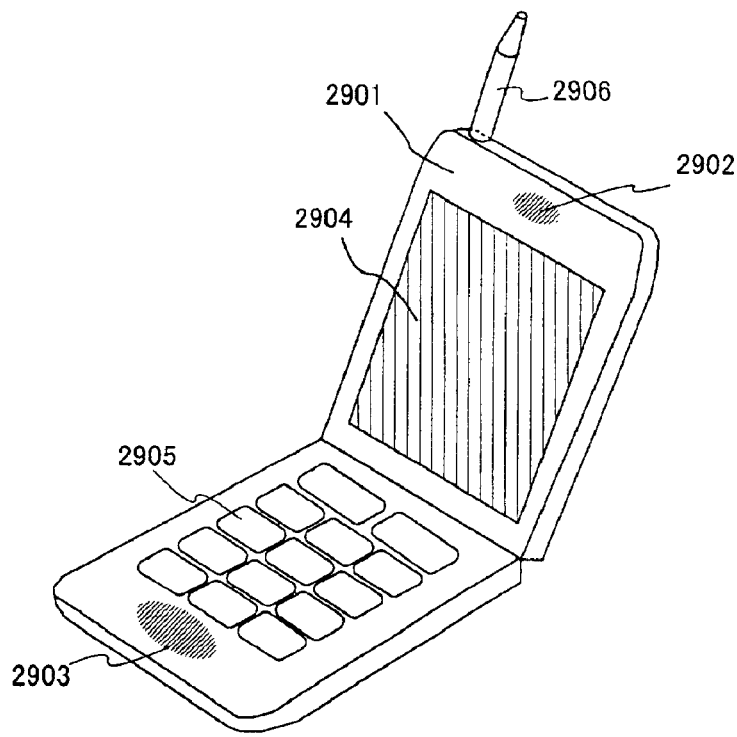
FIGS. 20A and 20C are examples of electronic devices.

FIG. 20A shows a portable phone which includes a main body 2901, a sound-output portion 2902, a sound-input portion 2903, a display portion 2904, controlling switches 2905, and an antenna 2906. The present invention can be applied to the sound-output portion 2902, the sound-input portion 2903, the display portion 2904, and other driving circuits.

Figure 20B:
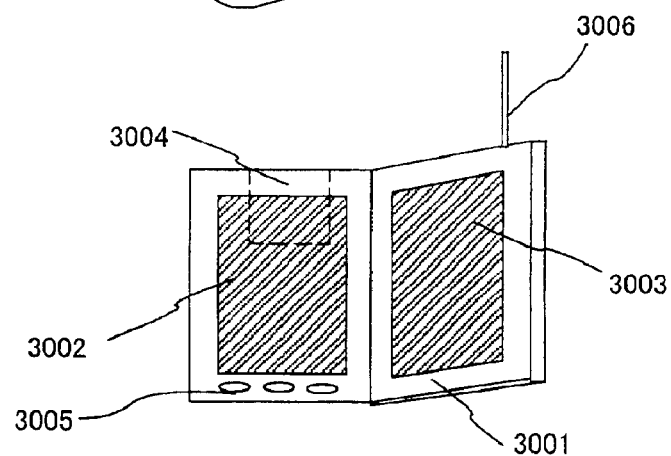

FIG. 20B shows a portable book (an electronic book) which a main body 3001, a display portion 3002 and 3003, a recording medium 3004, controlling switches 3005 and an antenna 3006. The present invention can be applied to the display portion 3002 and 3003, and other signal circuits.

Figure 20C:
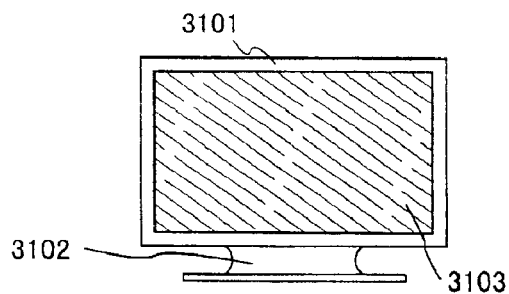

FIG. 20C shows a display which includes a main body 3101, a support 3102, and a display portion 3103. The present invention can be applied to the display portion 3103. Also, the present invention is particularly effective to the case of large size display, for example diagonal size of 10 inches or more (especially 30 inches or more).

As mentioned above, the present invention can be applied to a broad range of fields, including almost all electronic devices. Also, the electronic devices of this embodiment can be realized by any combination of Embodiments 1 to 13.

EFFECT OF THE INVENTION

As such, an organic material is used for inter-layer insulating films and the first metallic film is used as a mask in the dry etching process, thereby enabling forming contact holes (3 $\mu$m or less, or preferably 2 through 0.1 $\mu$m in diameter) finer than conventional ones.

Furthermore, in the present invention, the first inter-layer insulating film is made of an organic material, thereby enabling providing a sufficiently flat film compared with the case where an inorganic material is used. In addition, formation of the second and third inter-layer insulating films with an organic material allows the pixel electrodes to be formed on sufficiently flattened regions. Accordingly, rubbing can be positively carried out to eliminate the disorder in the alignment of liquid crystal.

Furthermore, a metallic material lower in resistance than the second metallic layer can be used as the first metallic film, thereby enabling reduction in the resistance of the wirings. In addition, a metallic material that is capable of forming an excellent contact interface with a semiconductor layer (such as silicon) can be used as the second metallic film, thereby enabling reduction in contact defects.

Furthermore, since the selective ratio between the organic material and the semiconductor layer predominantly composed of silicon can be ensured sufficiently, fine contact holes can be formed and thus the size of the display elements can be reduced. Consequently, a larger aperture ratio can be implemented.

What is claimed is:

1. A semiconductor device comprising:
   a first insulating film comprising an organic material formed over a conductive layer;
   a first metallic layer formed on said first insulating film;
   a second metallic layer formed on said first metallic layer;
   a second insulating film formed in contact with said second metallic layer, said first metallic layer and said first insulating film; and
   a pixel electrode formed on said second insulating film, said pixel electrode being connected to said second metallic layer at the bottom of a contact hole provided in said second insulating film,
   wherein said conductive layer and said second metallic layer are directly connected to each other through a contact hole provided in said first metallic layer and said first insulating film.

2. The semiconductor device according to claim 1, wherein said first metallic layer is selected from the group consisting of aluminum and a material predominantly composed of aluminum.

3. The semiconductor device according to claim 1, wherein said second metallic layer is selected from the group consisting of titanium and a material predominantly composed of titanium.

4. The semiconductor device according to claim 1, wherein said organic material is an organic-based resin material predominantly selected from the group consisting of polyimide, polyimide-amide, polyamide, acrylics, and BCB (benzocyclobutane).

5. The semiconductor device according to claim 1, wherein said semiconductor device is selected form the group consisting of an active matrix liquid-crystal display device, an active matrix EL display device, and an active matrix EC display device.

6. The semiconductor device according to claim 1, wherein said semiconductor device is selected from the group consisting of a video camera, a digital camera, a projector, a goggle-type display device, a car navigation device, a personal computer, and a portable information terminal.

7. A semiconductor device comprising:
   a first insulating film comprising an organic material formed over a thin film transistor;
   a first metallic layer formed on said first insulating film;
   a second metallic layer formed on said first metallic layer;
   a second insulating film formed in contact with said second metallic layer, said first metallic layer and said first insulating film; and
   a pixel electrode formed on said second insulating film, said pixel electrode being connected to said second metallic layer at the bottom of a contact hole provided in said second insulating film, wherein a source region or a drain region of said thin film transistor and said second metallic layer are directly connected to each other through a contact hole provided in said first metallic layer and said first insulating film.

8. The semiconductor device according to claim 7, wherein said first metallic layer is selected from the group consisting of aluminum and a material predominantly composed of aluminum.

9. The semiconductor device according to claim 7, wherein said second metallic layer is selected from the group consisting of titanium and a material predominantly composed of titanium.

10. The semiconductor device according to claim 7, wherein said organic material is an organic-based resin material selected from the group consisting of polyimide, polyimide-amide, polyamide, acrylics, and BCB (benzocyclobutane).

11. The semiconductor device according to claim 7, wherein said semiconductor device is selected from the group consisting of an active matrix liquid-crystal display device, an active matrix EL display device, and an active matrix EC display device.

12. The semiconductor device according to claim 7, wherein said semiconductor device is selected from the group consisting of a video camera, a digital camera, a projector, a goggle-type display device, a car navigation device, a personal computer, and a portable information terminal.

13. A semiconductor device comprising:
a first insulating film comprising an organic material formed over a thin film transistor;
a first conductive layer formed on said first insulating film;
a second conductive layer formed on said first conductive layer;
a second insulating film formed in contact with said second conductive layer, said first conductive layer and said first insulating film; and
a pixel electrode formed on said second insulating film, said pixel electrode being connected to said second conductive layer at the bottom of a contact hole provided in said second insulating film,
wherein a source region or a drain region and said second conductive layer are directly connected to each other through a contact hole provided in said first conductive layer and said first insulating film,
wherein said second conductive layer is contact with said first insulating film inside of said contact hole.

14. The semiconductor device according to claim 13, wherein said first conductive layer is selected from the group consisting of aluminum and a material predominantly composed of aluminum.

15. The semiconductor device according to claim 13, wherein said second conductive layer is selected from the group consisting of titanium and a material predominantly composed of titanium.

16. The semiconductor device according to claim 13, wherein said organic material is an organic-based resin material predominantly selected from the group consisting of polyimide, polyimide-amide, polyamide, acrylics, and BCB (benzocyclobutane).

17. The semiconductor device according to claim 13, wherein said semiconductor device is selected from the group consisting of an active matrix liquid-crystal display device, an active matrix EL display device, and an active matrix EC display device.

18. The semiconductor device according to claim 13, wherein said semiconductor device is selected from the group consisting of a video camera, a digital camera, a projector, a goggle-type display device, a car navigation device, a personal computer, and a portable terminal.

19. A semiconductor device comprising:
a thin film transistor formed over a substrate, said thin film transistor having a semiconductor layer and a gate electrode adjacent to said semiconductor layer with a gate insulating film interposed therebetween;
a first insulating film comprising an organic material formed over said thin film transistor;
a first conductive layer formed on said first insulating film;
a second conductive layer formed on said first conductive layer;
a second insulating film formed in contact with said second conductive layer, said first conductive layer and said first insulating film; and
a pixel electrode formed on said second insulating film, said pixel electrode being connected to said second conductive layer at the bottom of a contact hole provided in said second insulating film,
wherein said second conductive layer is directly connected to said semiconductor layer through a contact hole provided in said first conductive layer and said first insulating film.

20. The semiconductor device according to claim 19, wherein said first conductive layer is selected from the group consisting of aluminum and a material predominantly composed of aluminum.

21. The semiconductor device according to claim 19, wherein said second conductive layer is selected from the group consisting of titanium and a material predominantly composed of titanium.

22. The semiconductor device according to claim 19, wherein said organic material is an organic-based resin material predominantly selected from the group consisting of polyimide, polyimide-amide, polyamide, acrylics, and BCB (benzocyclobutane).

23. The semiconductor device according to claim 19, wherein said semiconductor device is selected from the group consisting of an active matrix liquid-crystal display device, an active matrix EL display device, and an active matrix EC display device.

24. The semiconductor device according to claim 19, wherein said semiconductor device is selected from the group consisting of a video camera, a digital camera, a projector, a goggle-type display device, a car navigation device, a personal computer, and a portable information terminal.

25. A semiconductor device comprising:
a thin film transistor formed over a substrate, said thin film transistor having a semiconductor layer and a gate electrode adjacent to said semiconductor layer with a gate insulating film interposed therebetween;
a first insulating film comprising an organic material formed over said thin film transistor;
a first conductive layer formed on said first insulating film;
a second conductive layer formed on said first conductive layer;
a second insulating film formed in contact with said second conductive layer, said first conductive layer and said first insulating film; and a pixel electrode formed on said second insulating film, said pixel electrode being connected to said second conductive layer at the bottom of a contact hole provided in said second insulating film, wherein said second conductive layer is directly connected to said semiconductor layer through a contact hole provided in said first conductive layer and said first insulating film.

26. The semiconductor device according to claim 25, wherein said first conductive layer is selected from the group consisting of aluminum and a material predominantly composed of aluminum.

27. The semiconductor device according to claim 25, wherein said second conductive layer is selected from the group consisting of titanium and a material predominantly composed of titanium.

28. The semiconductor device according to claim 25, wherein said organic material is an organic-based resin material predominantly selected from the group consisting of polyimide, polyimide-amide, polyamide, acrylics, and BCB (benzocyclobutane).

29. The semiconductor device according to claim 25, wherein said semiconductor device is selected from the group consisting of an active matrix liquid-crystal display device, an active matrix EL display device, and an active matrix EC display device.

30. The semiconductor device according to claim 25, wherein said semiconductor device is selected from the group consisting of a video camera, a digital camera, a projector, a goggle-type display device, a car navigation device, a personal computer, and a portable information terminal.

31. A semiconductor device comprising:

a thin film transistor formed over a substrate, said thin film transistor having a semiconductor layer and a gate electrode adjacent to said semiconductor layer with a gate insulating film interposed therebetween;

a first insulating film comprising an organic material formed over said thin film transistor;

a first wiring formed on said first insulating film;

a second wiring formed on said first wiring;

a second insulating film formed in contact with said second wiring, said first wiring and said first insulating film; and a pixel electrode formed on said second insulating film, said pixel electrode being connected to said second wiring at the bottom of a contact hole provided in said second insulating film, wherein said second wiring is directly connected to said semiconductor layer through a contact hole provided in said first wiring and said first insulating film.

32. The semiconductor device according to claim 31, wherein said first wiring is selected from the group consisting of aluminum and a material predominantly composed of aluminum.

33. The semiconductor device according to claim 31, wherein said second wiring is selected from the group consisting of titanium and a material predominantly composed of titanium.

34. The semiconductor device according to claim 31, wherein said first insulating layer comprises an organic-based resin material predominantly selected from the group consisting of polyimide, polyimide-amide, polyamide, acrylics, and BCB (benzocyclobutane).

35. The semiconductor device according to claim 31, wherein said semiconductor device is selected from the group consisting of an active matrix liquid-crystal display device, an active matrix EL display device, and an active matrix EC display device.

36. The semiconductor device according to claim 31, wherein said semiconductor device is selected from the group consisting of a video camera, a digital camera, a projector, a goggle-type display deice, a car navigation device, a personal computer, and a portable information terminal.

* * * * *